(12) United States Patent
Hashimoto et al.

(10) Patent No.: US 6,931,928 B2
(45) Date of Patent: Aug. 23, 2005

(54) MICROSTRUCTURE WITH MOVABLE MASS

(75) Inventors: Hiroyuki Hashimoto, Hyogo (JP); Takahiko Ooasa, Hyogo (JP); Naoki Ikeuchi, Hyogo (JP); Muneo Harada, Hyogo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/488,490

(22) PCT Filed: Sep. 2, 2002

(86) PCT No.: PCT/JP02/08879

§ 371 (c)(1),
(2), (4) Date: Jul. 23, 2004

(87) PCT Pub. No.: WO03/023414

PCT Pub. Date: Mar. 20, 2003

(65) Prior Publication Data

US 2005/0016271 A1 Jan. 27, 2005

(30) Foreign Application Priority Data

| Sep. 4, 2001 | (JP) | 2001-266604 |
| Aug. 23, 2002 | (JP) | 2002-244282 |
| Aug. 23, 2002 | (JP) | 2002-244283 |

(51) Int. Cl.[7] ............................................. G01P 15/12
(52) U.S. Cl. .................................. 73/514.33; 73/514.38
(58) Field of Search ......................... 73/514.33, 514.36, 73/514.37, 514.38, 514.21, 514.22, 514.23, 514.24, 514.01, 514.02, 862.382

(56) References Cited

U.S. PATENT DOCUMENTS

| 4,129,042 A | * | 12/1978 | Rosvold | 73/514.33 |
| 4,955,234 A | * | 9/1990 | Marek | 73/514.33 |
| 5,191,794 A | * | 3/1993 | Abbink et al. | 73/514.23 |
| 5,894,090 A | | 4/1999 | Tang et al. | |

FOREIGN PATENT DOCUMENTS

JP        1-163620       6/1989

\* cited by examiner

*Primary Examiner*—John E. Chapman
(74) *Attorney, Agent, or Firm*—Finnegan Henderson Farabow Garrett & Dunner, L.L.P.

(57) ABSTRACT

A microstructure includes a mass; a base member in which the mass is movably contained. The mass includes a surface, which is exposed out of the base member, and a stopper wire, which is arranged above the surface of the mass so as to inhibit over move of the mass.

15 Claims, 28 Drawing Sheets

MICROSTRUCTURE WITH MOVABLE MASS

TECHNICAL FIELD

The present invention relates generally to a microstructure with a movable mass (or moving mass). The present invention particularly relates to an accelerometer, which detects physical movement of a mass.

BACKGROUND ART

There are a variety of types of sensors using a movable mass(moving mass). For example, there is an inertial sensor such as an accelerometer and an angular accelerometer (vibration gyroscope).

An accelerometer, which detects an acceleration of a vehicle, generally uses a piezoresistive effect. According to such a sensor, for example, a box shape of seismic mass (i.e. moving mass) is contained in a cavity of a silicon base member (fixed frame). The movable mass is suspended by beams on which piezoresistors are formed, so that a stress is applied to the piezoresistors in response to movement of the mass. The variation of stress applied to the piezoresistors is detected as a variation of resistance. Such technology can be used for cruise control of vehicles.

The above-described mass is required to move freely, however, if the mass over moves, the sensor may be broken or damaged. According to an invention shown in Japanese Patent Publication Kokoku H5-71448, a glass stopper is used for inhibiting over-move of the mass.

However, because the glass stopper is arranged above the mass, the thickness of the sensor is increased, and the fabrication process is more complicated. Thus fabrication costs are increased. Further, stress generated between the glass and silicon member may negatively affect the characteristics of the sensor.

DISCLOSURE OF INVENTION

Accordingly, it is an object of the present invention to provide a microstructure, in which over-move of a mass can be inhibited without significant increase of thickness. Another object of the present invention is to provide a microstructure, in which an over-move inhibiting mechanism is realized without without negatively affecting the characteristics of the microstructure and with increasing the complexity or expense of its fabrication.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

According to a first aspect of the present invention, a microstructure includes a mass, and a base member in which the mass is movably contained. The mass includes a surface, which is exposed out of the base member, and a stopper wire, which is arranged above the surface of the mass so as to inhibit over move of the mass. As compared to the conventional technology using a glass stopper, the microstructure of the present invention can be fabricated to have a reduced thickness. When stopper wires are fixed, no stress is applied to the base member and the mass. As a result, no negative affects are imparted to the characteristics of the microstructure, which can be an accelerometer. Further, the stopper wires can be fixed in a wire-bonding process, so that the fabrication process can be uncomplicated, thereby allowing the cost of fabrication to be minimized. Especially, when the microstructure is an accelerometer, the stopper wires can be formed at the same time when electrode pads of a sensor chip and lead pads of a package are wire bonded for electrical connection.

According to a second aspect of the present invention, a package structure containing the above-described microstructure includes at least one lead pad used for electrical connection with the microstructure. At least one end of the stopper wire is connected to the lead pad. The stopper wires can be arranged freely and be changed easily in design. When one end of the stopper wire is connected to an electrode pad of the base member and the other end is connected to a lead pad of the package, the stopper wire can be used not only for mechanical protection but also for electrical connection.

According to a third aspect of the present invention, the stopper wire includes ends to be fixed at positions which are relatively lower in level than the surface of the mass. It is difficult to arrange a bonding wire having a height or clearance. If a clearance of a bonding wire is less than 100 µm, the clearance would be made irregularly. According to the present invention, a distance or clearance between an upper surface of a mass and a stopper wire can be decreased without increasing a distance in vertical direction between ends and top of the wire. As a result, the thickness of a microstructure can be reduced without increasing irregularity of clearance or the height of the stopper wires.

According to a fourth aspect of the present invention, an accelerometer includes a mass, and a silicon base member in which the mass is movably contained, wherein the mass comprises a surface which is exposed out of the base member, a stopper wire which is arranged above the surface of the mass so as to inhibit over move of the mass; and a package which contains the base member and the mass.

BEST MODE FOR CARRYING OUT THE INVENTION

In the following detailed description of the preferred embodiments, reference is made to the accompanying drawings that form a part hereof, in which is shown, by way of illustration, specific preferred embodiments in which the invention may be practiced. These preferred embodiments are described in sufficient detail to enable those skilled in the art to practice the invention. However, it is to be understood that other preferred embodiments may be utilized, and that logical, mechanical and electrical changes may be made without departing from the spirit and scope of the present invention. The following detailed description is therefore not to be taken in a limiting sense, and the scope of the present invention is defined only by the appended claims.

Now the present invention is described. The present invention is applicable to a variety of types of inertial sensors, such as an accelerometer, and an angular accelerometer (vibration gyroscope). The present invention is also applicable to any kind of microstructure (MEMS) having a movable member, such as an actuator.

Figure 1:
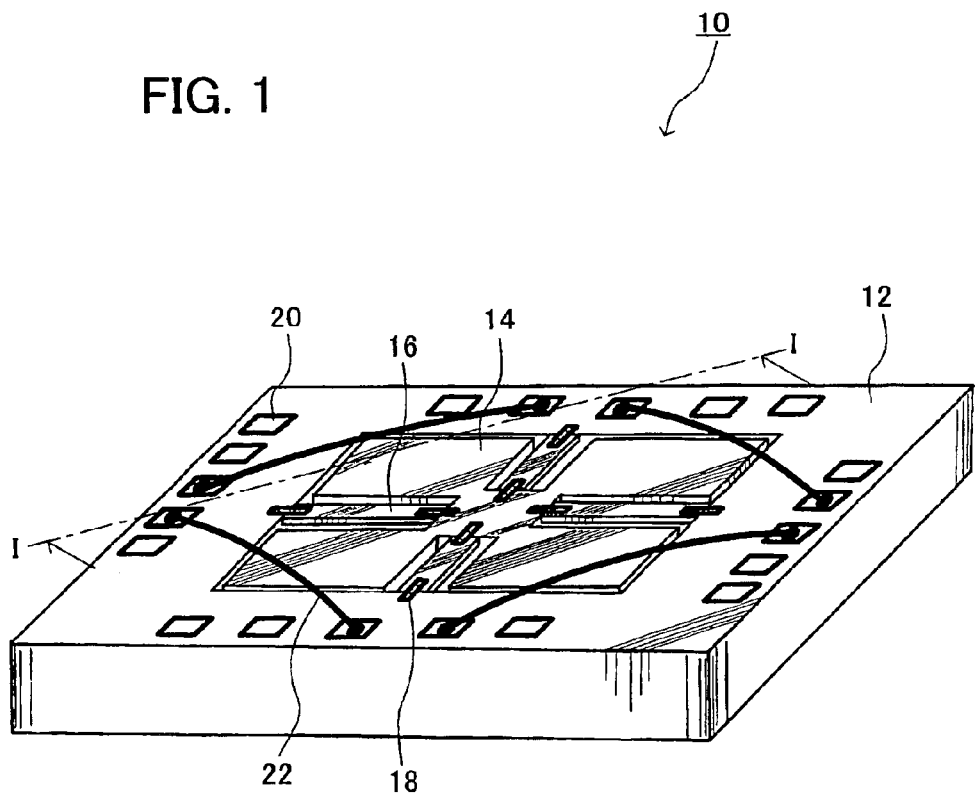
FIG. 1 is a perspective view illustrating an accelerometer according to a first preferred embodiment of the present invention.
Figure 2:
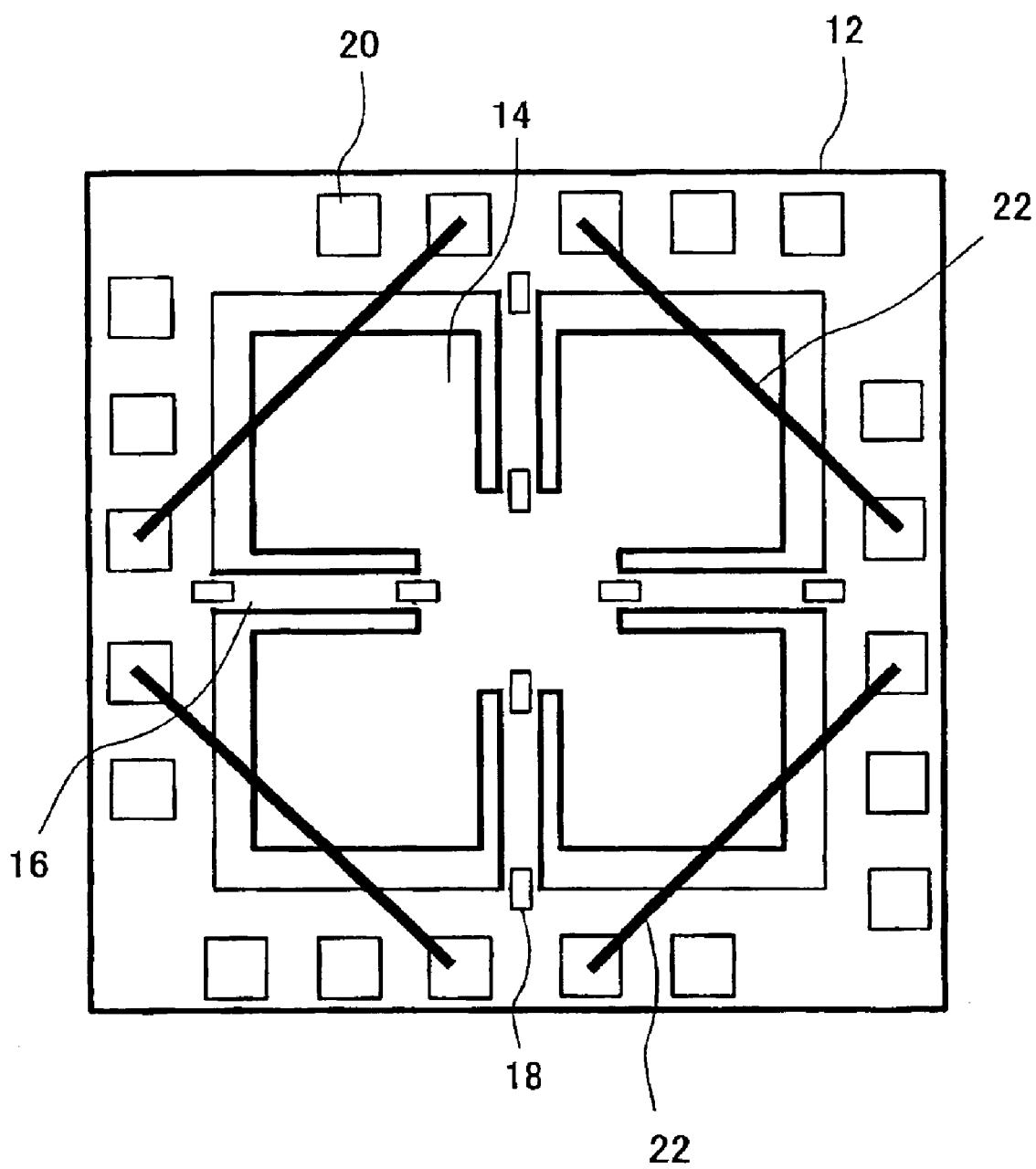
FIG. 2 is a plane view showing the accelerometer shown in FIG. 1, in which small elements like metal interconnection are omitted.
Figure 3:
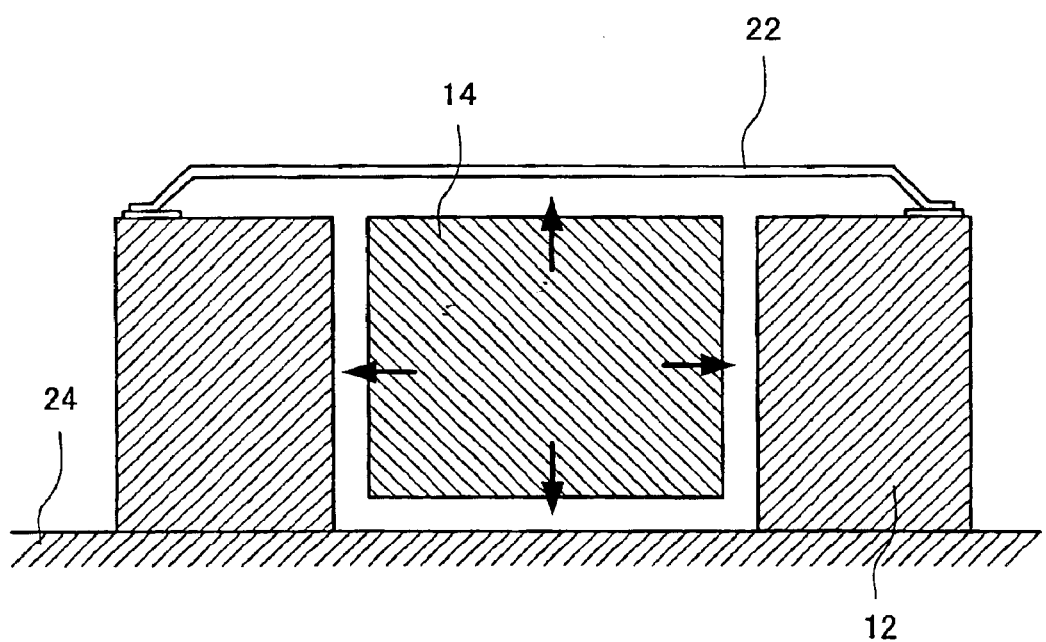
FIG. 3 is a cross-sectional view taken on line I—I in FIG. 1.

FIGS. 1 and 2 show an accelerometer 10 according to a first preferred embodiment of the present invention. In FIG. 2, small parts, such as metal interconnection, are not shown for better understanding of overall of the accelerometer 10. FIG. 3 shows an inside structure of the accelerometer 10. The accelerometer 10 includes a silicon base member 12, and a movable mass 14, which is contained in a cavity of the silicon base member 12. The mass 14 is provided so as to be able to move up-and-down and right-and-left in three-dimensions. The silicon base member 12 has at its center a square shaped cavity, in which the mass 14 is contained. The movable mass 14 is shaped to be a cloverleaf having four square regions, which are connected at the center thereof, in order to increase inertia force. An upper surface of the movable mass 14 and an upper surface of the base member 12 are arranged in the same level.

The accelerometer 10 further includes four beams 16, which connect the mass 14 and base member 12, and eight piezoresistance elements 18. The piezoresistance elements 18 are arranged at the boundaries between the mass 14 and the beams 16, between the base member 12 and the beams 16. Each of the beams 16 is arranged at a gap formed between two adjacent square parts of the mass 14. The silicon base member 12 is provided at the upper surface with electrode pads, which are connected to the piezoresistance elements 18 with a metal interconnection (not shown).

Electrode pads 20, which are not connected to the piezoresistance elements 18, are connected to ends of stopper wires 22. Four of the wires 22 are arranged above all the corners of the movable mass 14. Each wire 22 is arranged to extend across a corner of the movable mass 14. The ends of the wire 22 are fixed to the electrode pads 20 by a conventional wire-bonding process.

As shown in FIG. 3, the silicon base member 12 is fixed on to a die bond surface 24. Downward over move of the movable mass 14 is inhibited by the die bond surface 24. Horizontal over-move of the mass 14 is inhibited by the inner walls of the silicon base member 12. Upward over-move of the mass 14 is inhibited by the wires 22. The clearance between the mass 14 and the wires 22 can be adjusted by controlling the wire bonding device. "Over-move," means movement that causes the accelerometer 10 to not work. For example, if the mass 14 over moves, the accelerometer 10 would be broken or would output a signal at a level over its maximum rated level.

Figure 4:
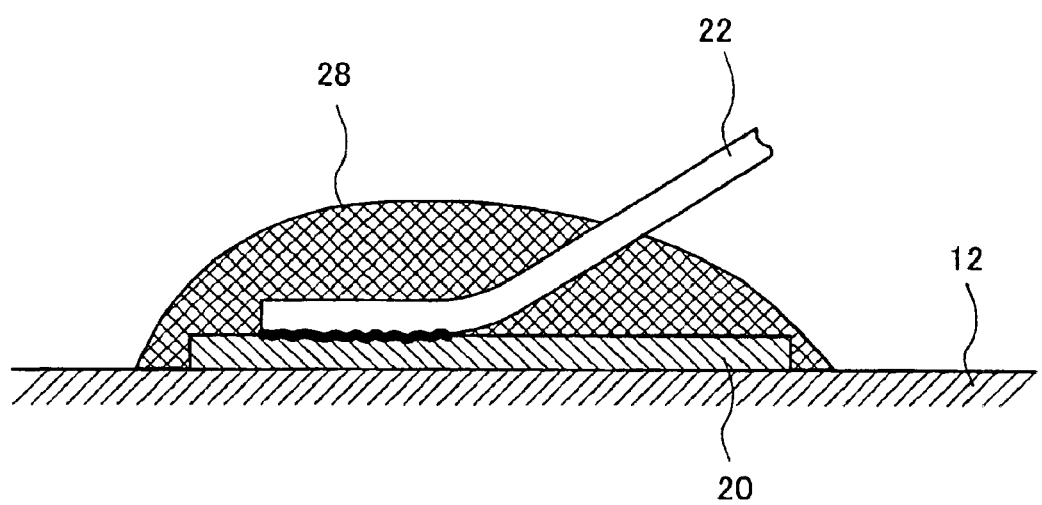
FIG. 4 is a cross-sectional view showing a part of the accelerometer shown in FIG. 1.

FIG. 4 shows a structure around an end of the wire 22 connected to the pad 20. According to the present invention, connecting regions between the wire 22 and the electrode pad 20 can be covered with a resin 28. As a result, the reliability of connection between the wire 22 and the pad 20 is increased.

To fabricate the above-described accelerometer 10, a SOI wafer is formed from a silicon layer (Si), a buried oxide layer (SiO2) and a Si substrate. A bridge circuit is formed on the SOI wafer using a semiconductor technology to form piezoresistance elements 18, a metal circuit pattern and electrode pads 20. After that, the surface is covered with a passivating film, such as SiN layer, except the electrode pads 20. Next, beams 16 are formed in a Si Deep RIE (Reactive Ion Etching) process. After that, the movable mass 14 is formed in a Si Deep RIE process carried out from the Si substrate. Next, the movable mass 14 is released from the substrate in an etching process to the buried oxide layer.

After that, the substrate is cut to form individual sensor chips in a dicing process. Next, the sensor chip is bonded in a package, then, the electrode pads 20 of the sensor chip 10 and lead pads of the package are wire bonded for electrical connection. At the same time, the wires 22 are formed over the sensor chip 10.

Figure 5:
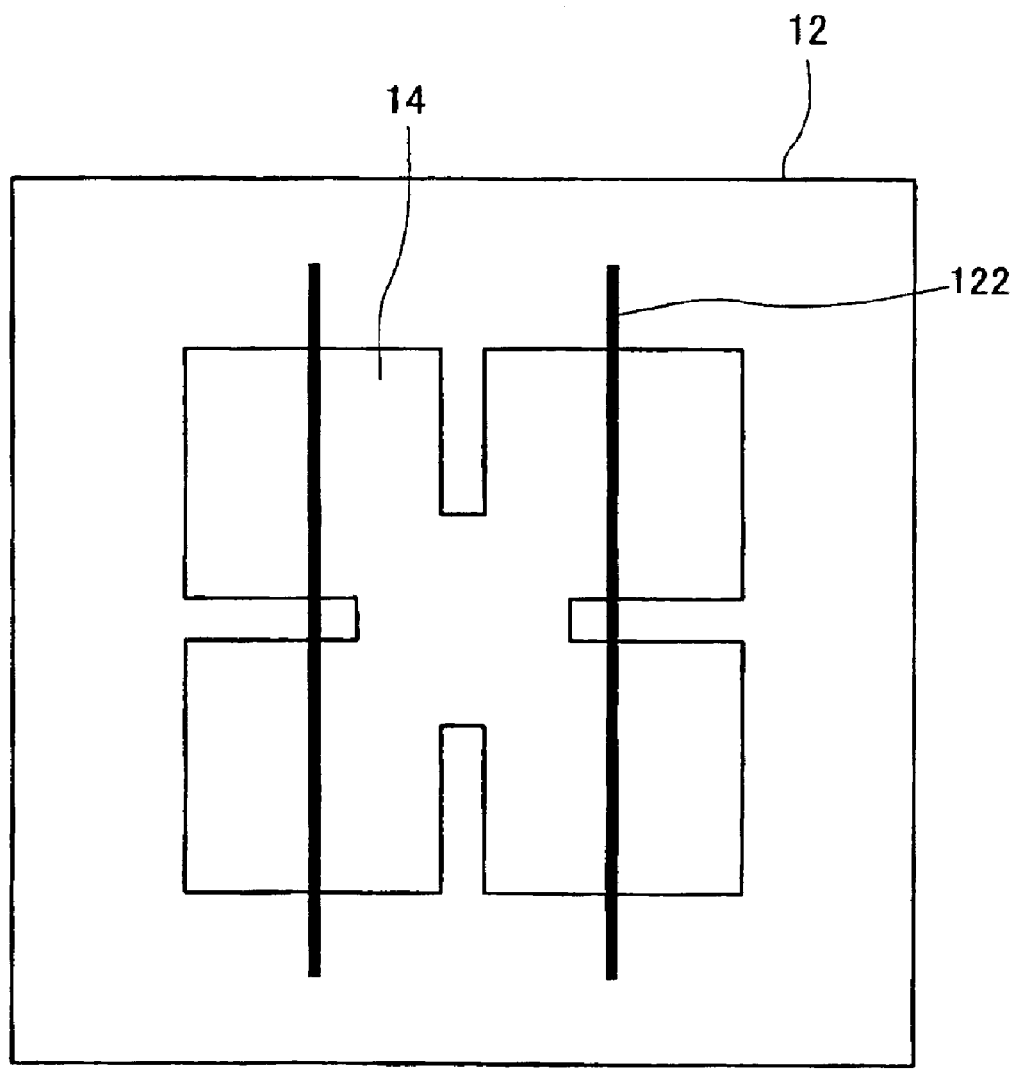
FIG. 5 is a plane view showing another arrangement of stopper wires used for an accelerometer according to the first preferred embodiment.
Figure 6:
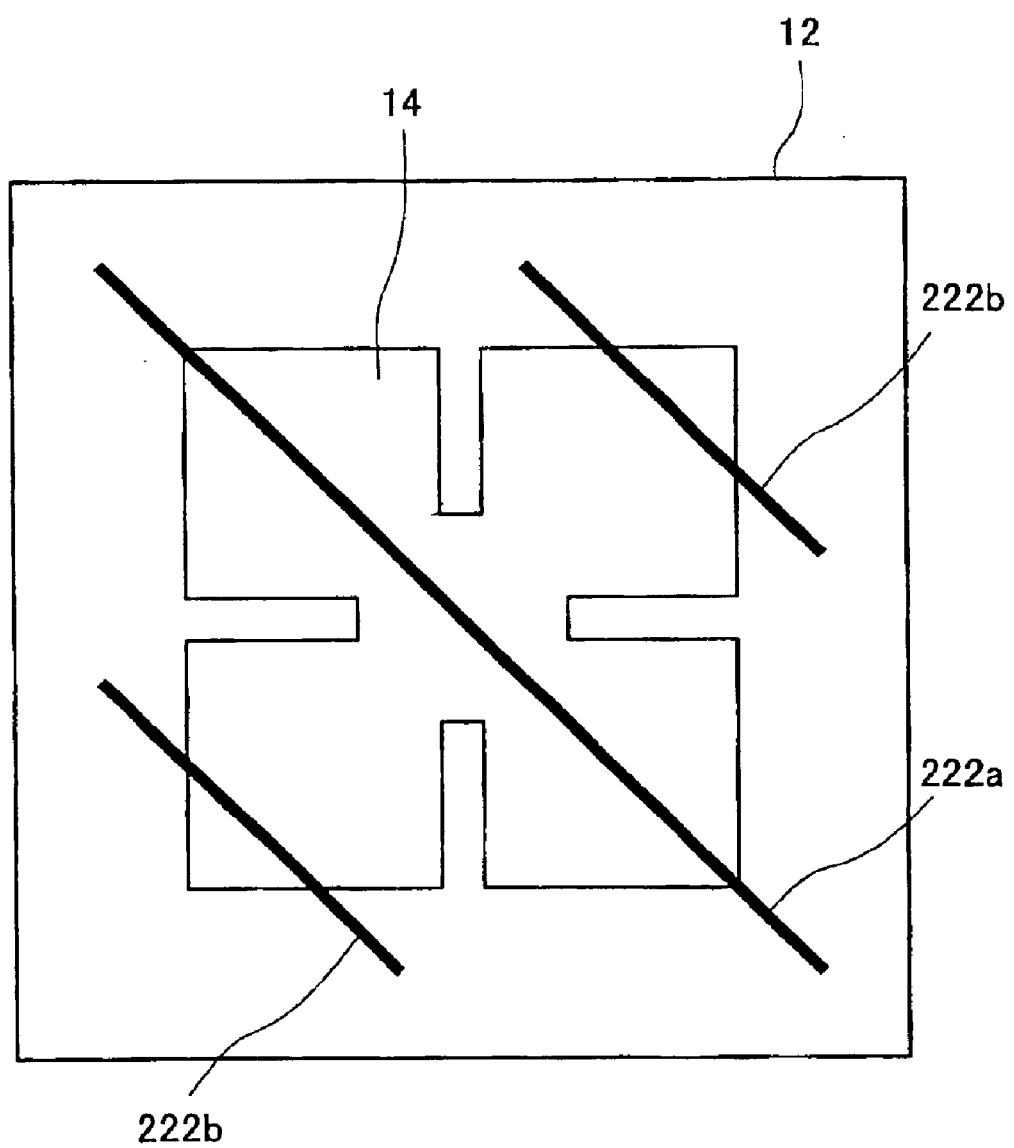
FIG. 6 is a plane view showing another arrangement of stopper wires used for an accelerometer according to the first preferred embodiment.

FIGS. 5 and 6 show an example of the arrangement of the stopper wire (22). According to FIG. 5, two of wires 122 are arranged in parallel to the sides of the silicon base member 12. These two wires 122 have the same length. According to FIG. 6, three of wires 222a and 222b are arranged in parallel to a diagonal line of the silicon base member 12. A longer wire 222a extends along a diagonal line of the silicon base member 12. Shorter wires 222b are extend to across over coiners of the movable mass 14 in the same manner as shown in FIG. 1. In FIG. 6, the shorter wires 222b can be omitted, because the longer wire 222a would be able to inhibit overmove of the mass 14 and keep the mass level.

Figure 7:
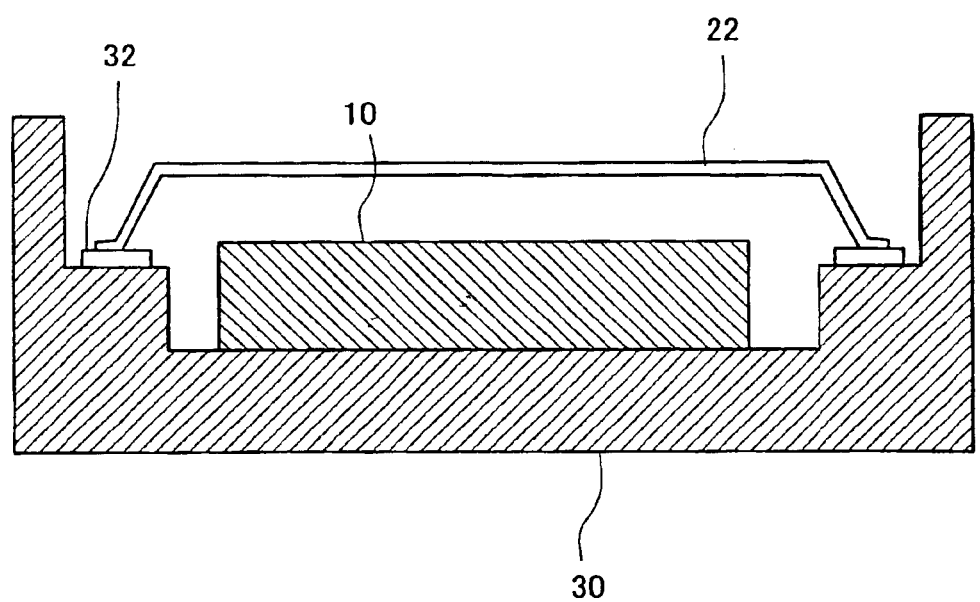
FIG. 7 is a cross-sectional view showing a package structure containing and an accelerometer according to a second preferred embodiment of the present invention.
Figure 8:
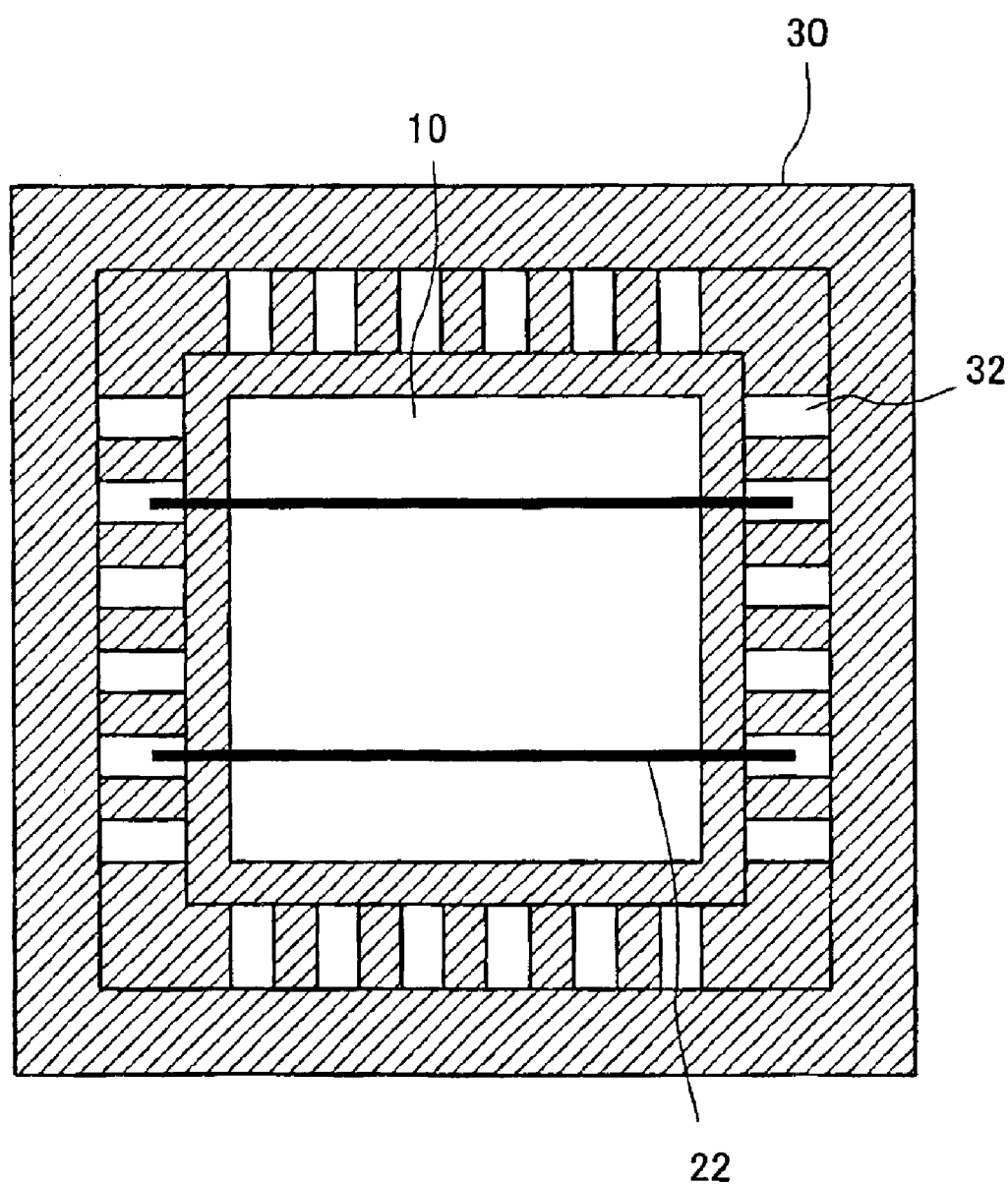
FIG. 8 is a plane view showing an arrangement of stopper wires used for an accelerometer according to the second preferred embodiment.
Figure 9:
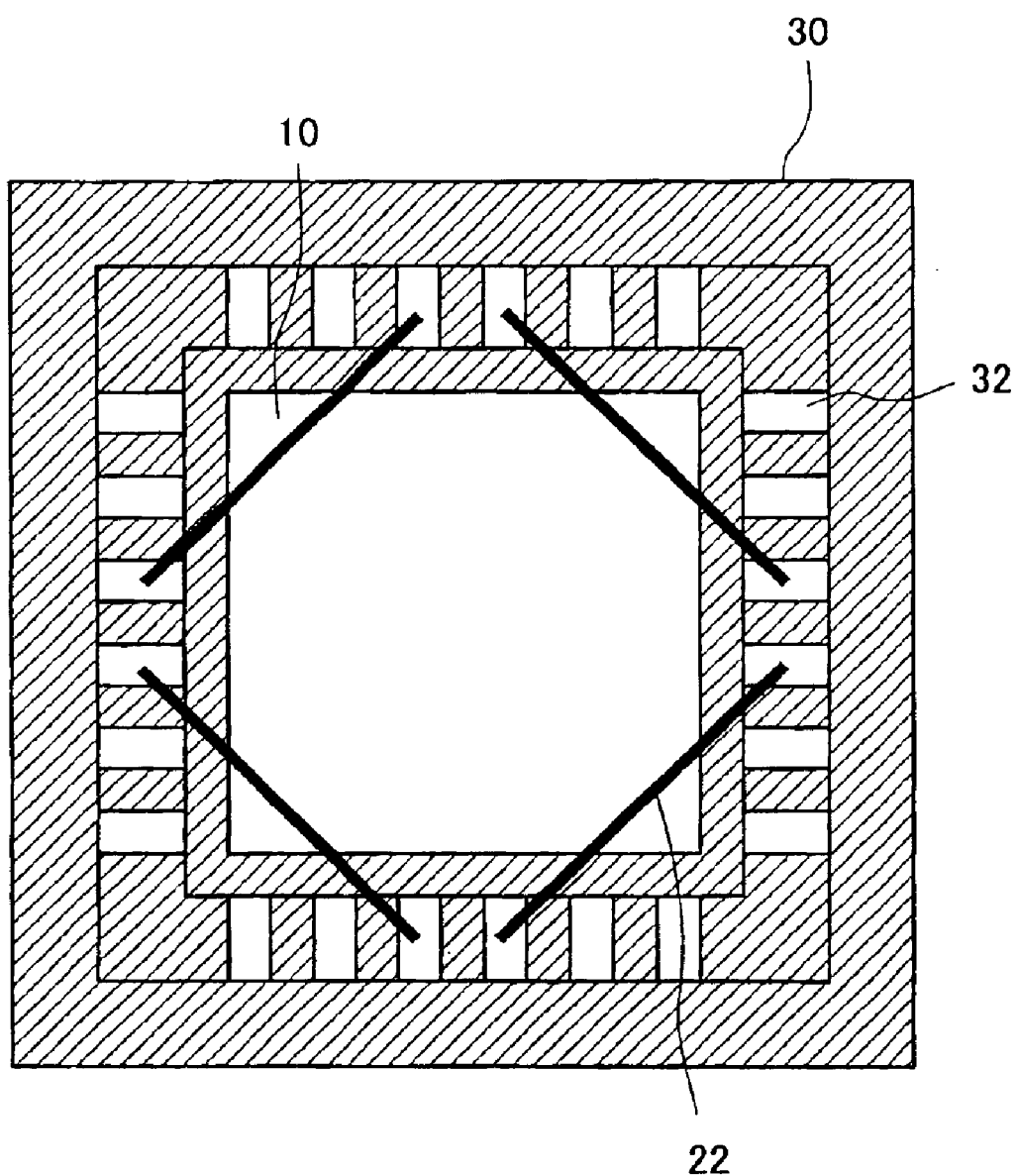
FIGS. 9–12 are plane views showing other arrangements of stopper wires used for the second preferred embodiment, shown in FIG. 7.
Figure 10:
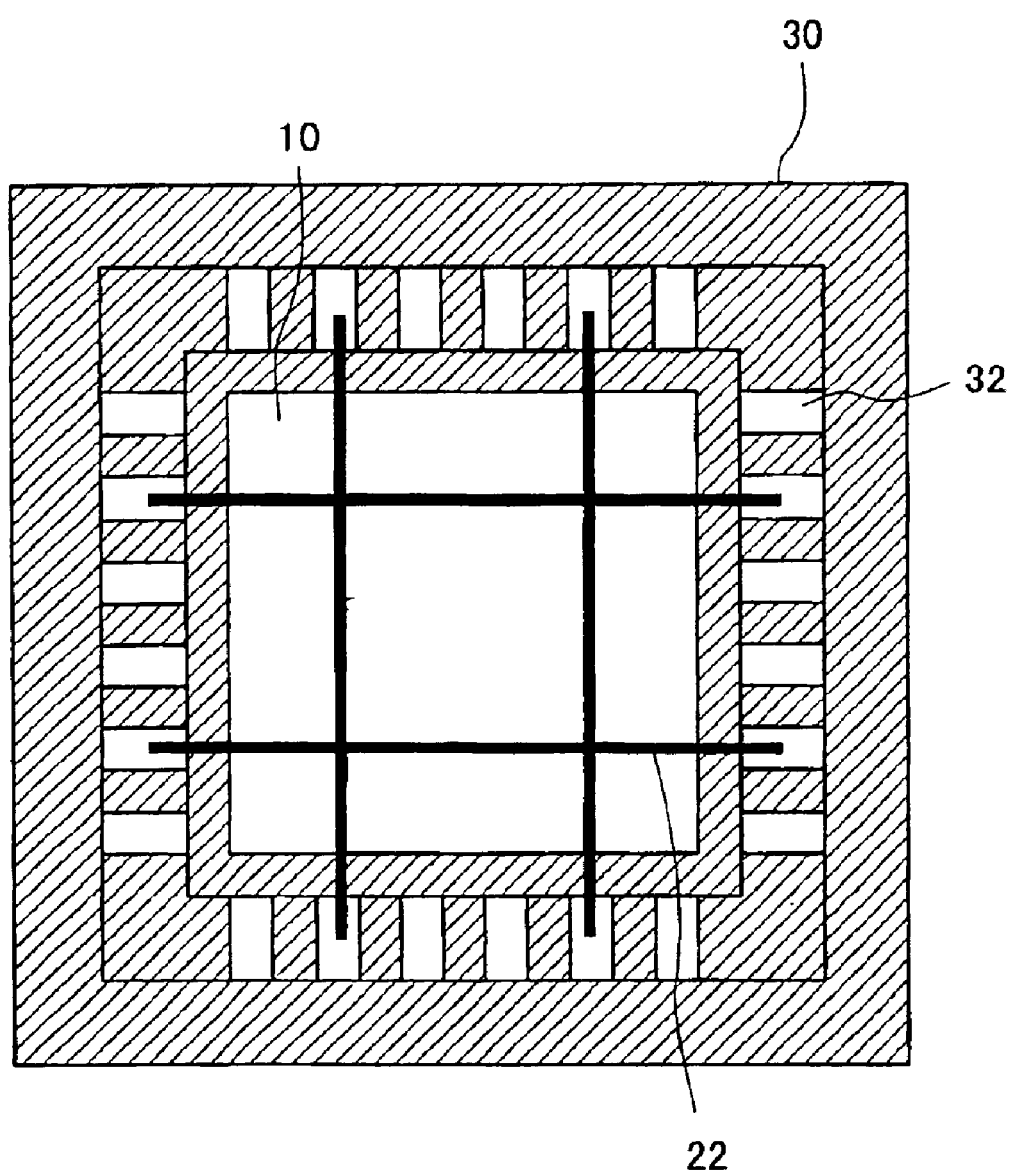
Figure 11:
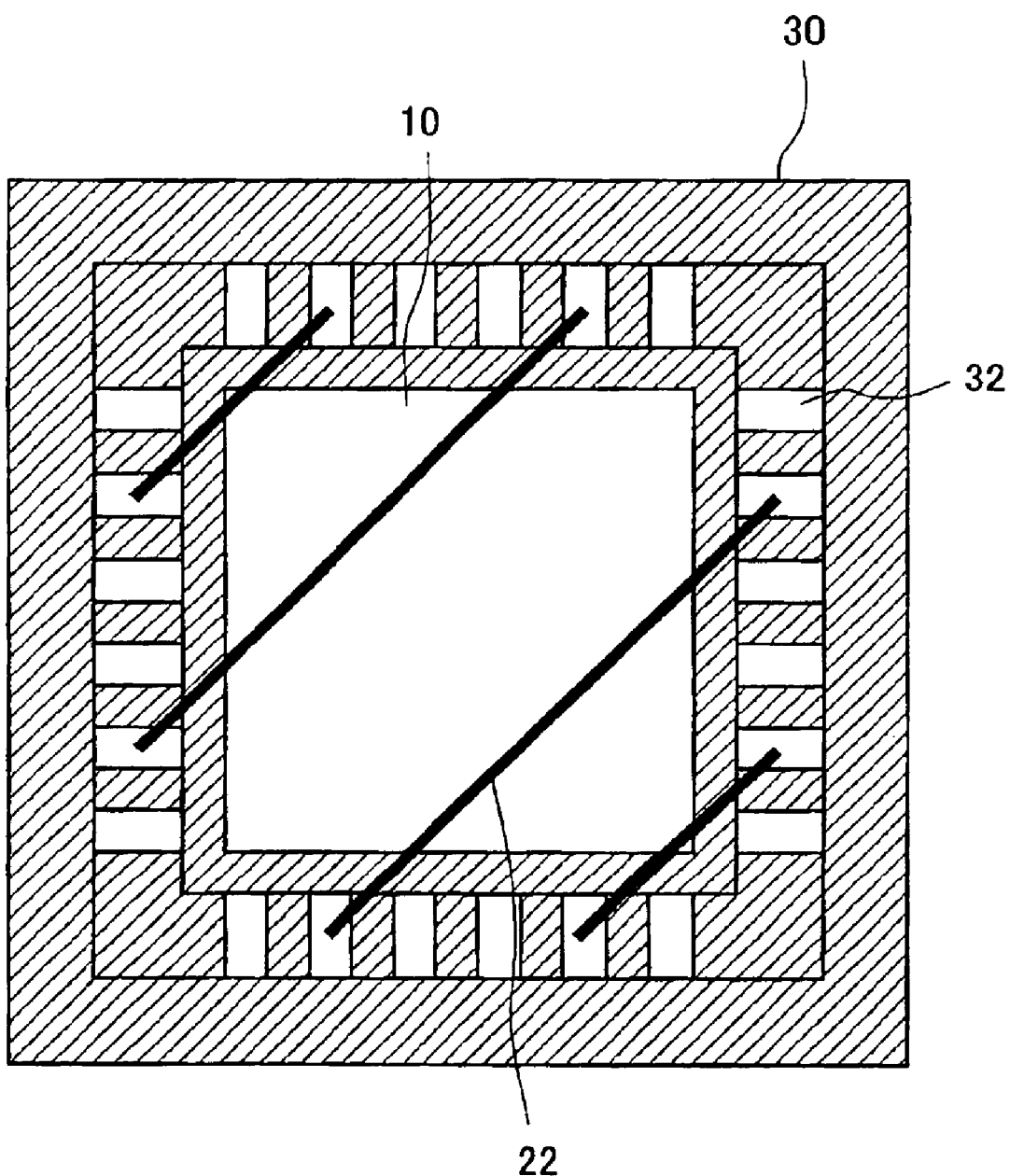
Figure 12:
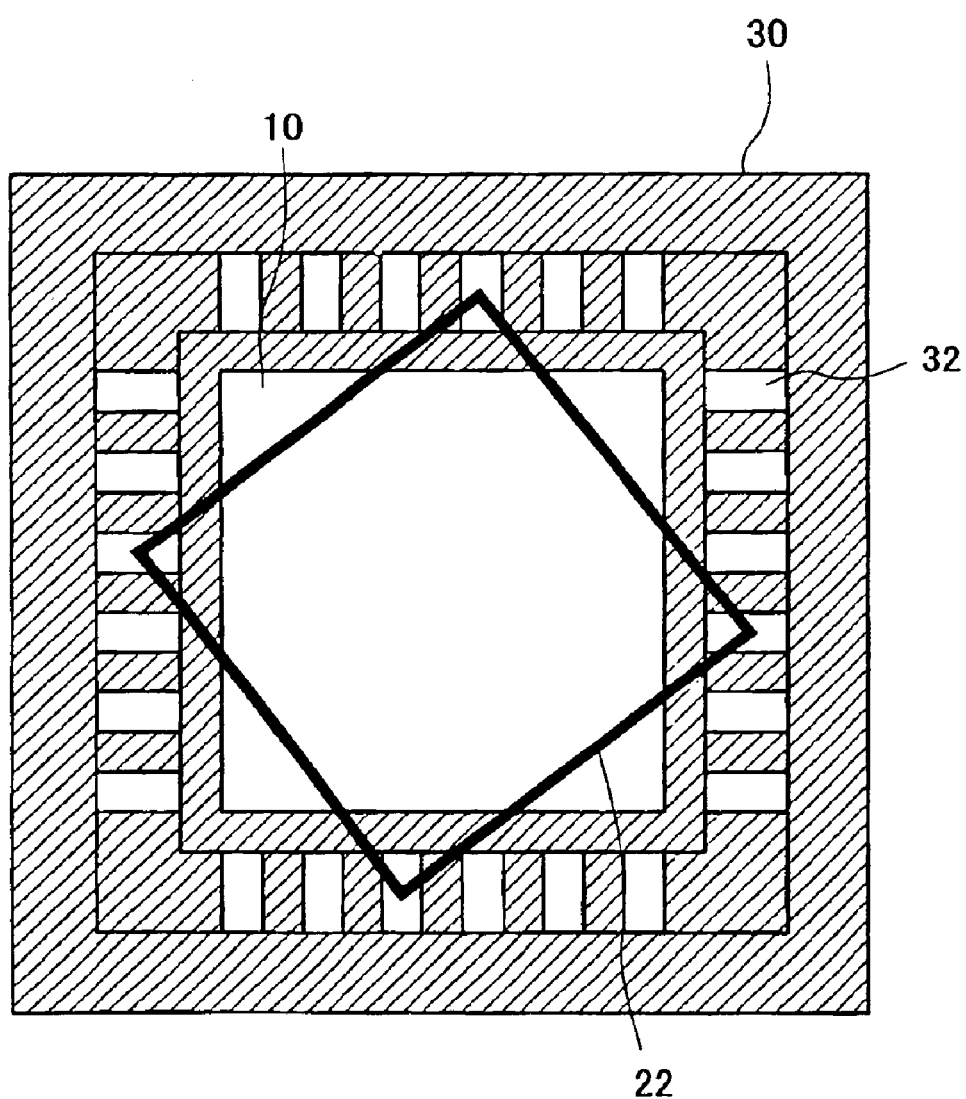

FIG. 7 is a cross-sectional view showing a package structure containing and an accelerometer 10 according to a second preferred embodiment of the present invention. In FIG. 7, the elements that are the same or correspond to elements in the first preferred embodiment are represented by the same reference number, and the same description is not repeated here in this embodiment. According to the second preferred embodiment, both ends of stopper wire 22 are fixed onto lead pads 32 of a package 30. As compared to the first preferred embodiment, the wire 22 can be arranged with a high degree of freedom.

FIGS. 8–12 are plane views showing example arrangements of stopper wires 22 used for the second preferred embodiment, shown in FIG. 7. According to the example shown in FIG. 8, two of wires 22 are arranged to extend in parallel to sides of the accelerometer 10. According to the examples shown in FIG. 9, four of wires 22 are arranged to extend across the corners of the accelerometer 10, in which none of the wires are crossed to each other. According to the example shown in FIG. 10, four of wires 22 are arranged to form a shape of "#" above the accelerometer 10. According to the example shown in FIG. 11, two shorter wires 22 and two longer wires 22 are arranged to extend in parallel to a diagonal line of the accelerometer 10. According to the example shown in FIG. 12, four of wires 22 are arranged to form a diamond shape, in which each wire 22 extend across a corner of the accelerometer 10.

Figure 13:
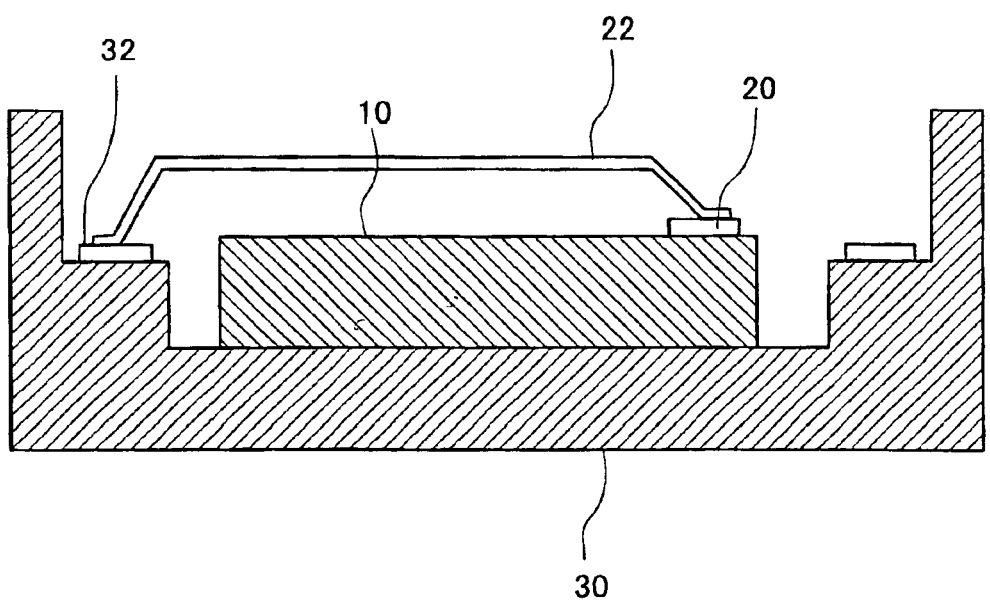
FIG. 13 is a cross-sectional view showing a package structure containing and an accelerometer according to a third preferred embodiment of the present invention.

FIG. 13 is a cross-sectional view showing a package structure containing and an accelerometer according to a third preferred embodiment of the present invention. In FIG. 13, the same or corresponding elements to those in the first and second preferred embodiment, are represented by the same reference number, and the same description is not repeated here in this embodiment.

According to the third preferred embodiment, one end of a stopper wire 22 is bonded onto a lead pad 32 of a package 30, and the other end is bonded on to an electrode pad 20 of an accelerometer 10. The stopper wires 22 can be used for electrical connection between the package 30 and the sensor 10. The lead pad 32 and electrode pad 20 can be formed for exclusive use for the stopper wires 22, so that the stopper wires 22 can be electrically isolated from the sensor 10, As a result, the stopper wires 22 can be arranged without taking into consideration of a wiring design of the sensor 10.

Figure 14:
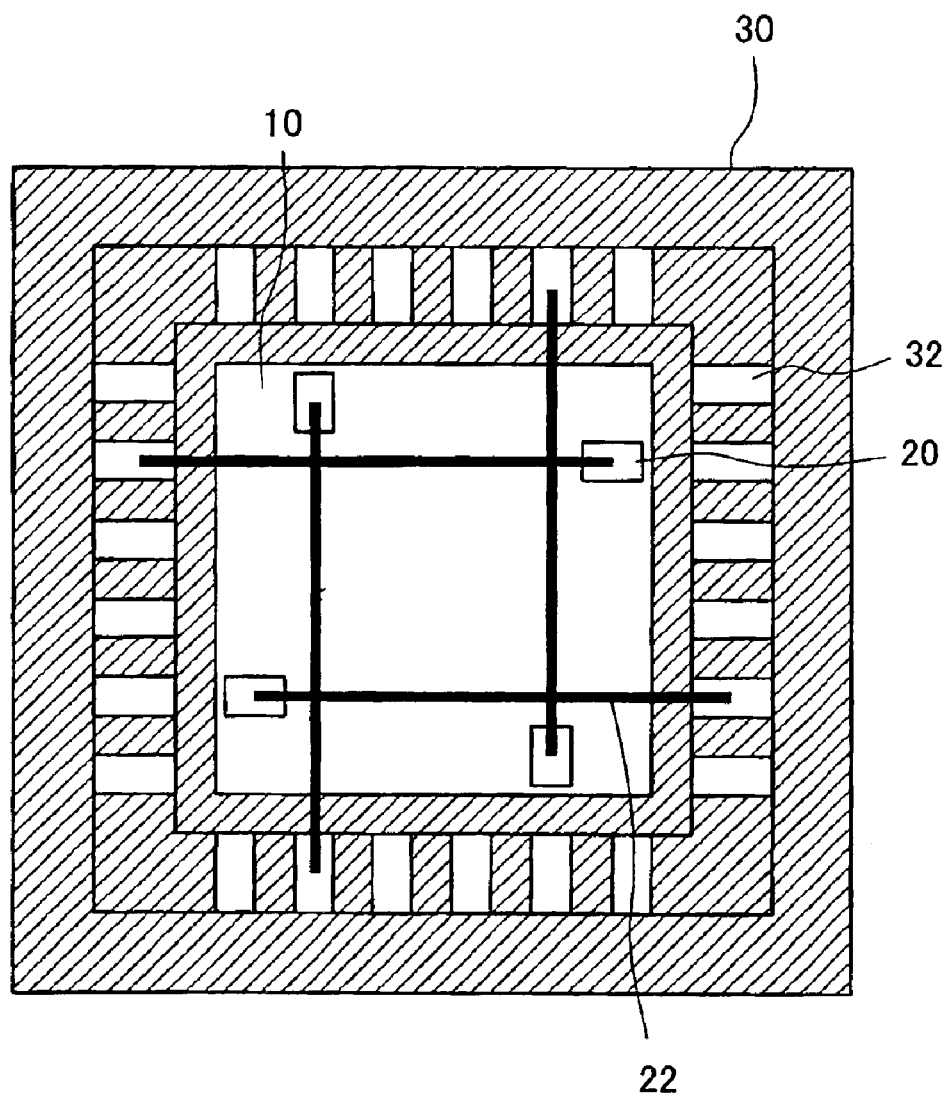
FIG. 14 is a plane view showing an arrangement of stopper wires used for an accelerometer according to the third preferred embodiment.
Figure 15:
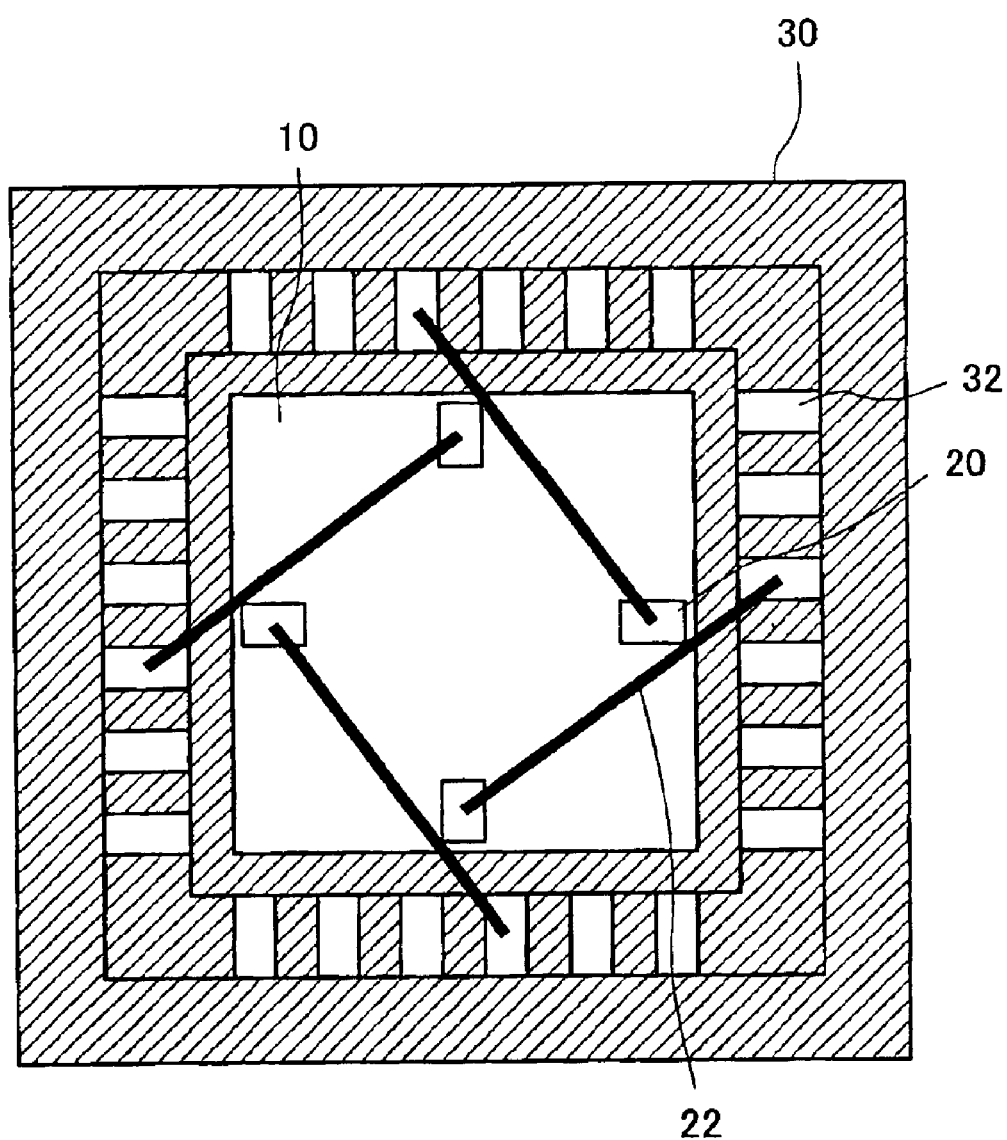
FIG. 15 is a plane view showing another arrangement of stopper wires used for an accelerometer according to the third preferred embodiment.

FIGS. 14 and 15 are plane views showing example arrangements of the stopper wires 22 used for the accelerometer 10 according to the third preferred embodiment. In a practical example shown in FIG. 14, four of wires 22 are arranged to form a shape of "#" above the accelerometer 10. In a practical example shown in FIG. 15, four of wires 22 are arranged to form a diamond shape, in which each wire 22 extend across a corner of the accelerometer 10.

Figure 16:
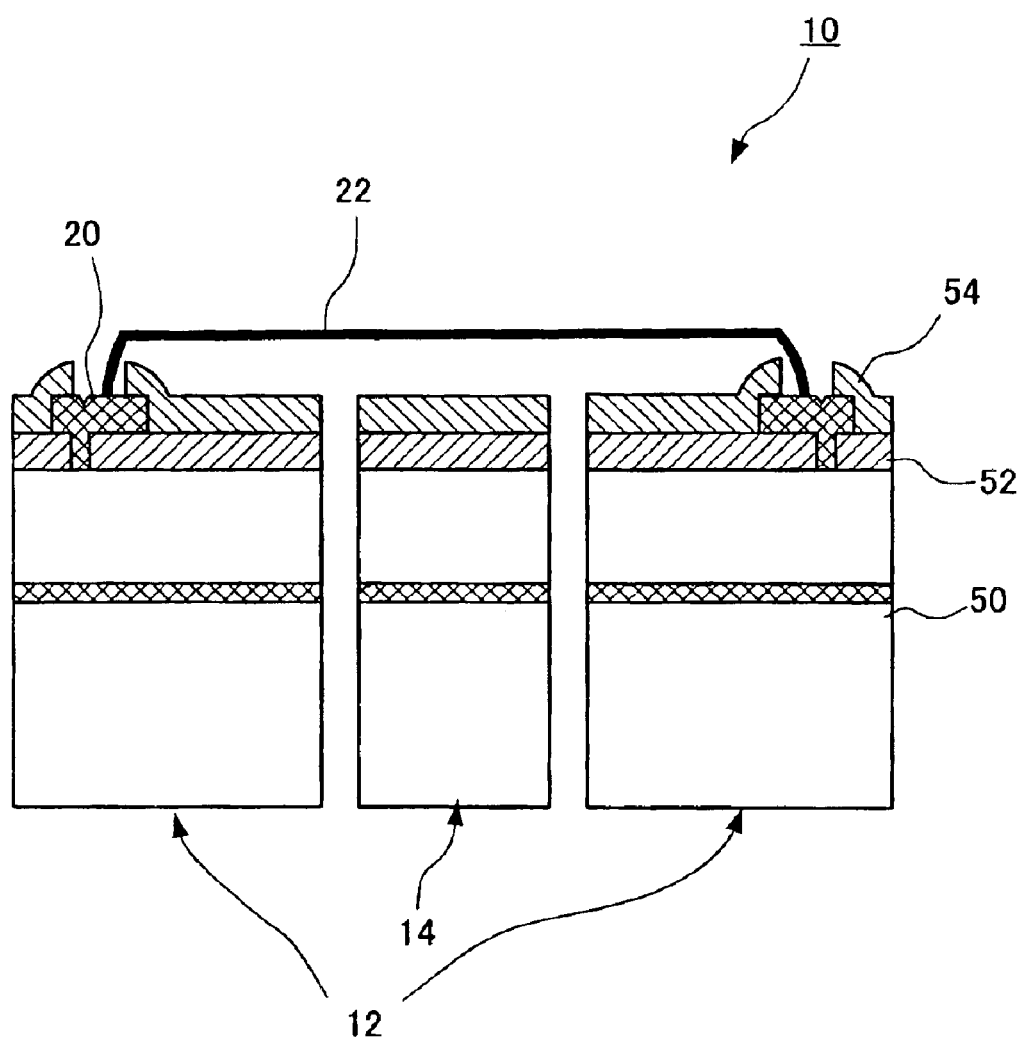
FIG. 16 is a cross-sectional view showing an accelerometer according to a fourth preferred embodiment of the present invention.

FIG. 16 is a cross-sectional view showing an accelerometer according to a fourth preferred embodiment of the present invention. In FIG. 16, the same or corresponding elements to those in the first to third preferred embodiments are represented by the same reference number, and their description is not repeated here in this embodiment. A feature of this embodiment is that stopper wires 22 are provided to have the same electrical potential level with an SOI wafer 50, so that the wires 22 do not operate as an antenna, which affects negatively to characteristics of the accelerometer 10.

In fabrication of the above-described accelerometer 10, a SOI wafer is formed from a silicon layer (Si), a buried oxide layer (SiO2) and a Si substrate. A bridge circuit is formed on the silicon layer in an ion implantation or thermal diffusion process to form piezoresistance elements 18. After that, an insulating layer 52 is formed in a thermal oxidation process. Next, contact holes are formed so as that an electrode pad 20, which is connected to the wire 22, becomes the same electrical potential level as the silicon layer (Si). After that, a metal circuit pattern and electrode pads 20 are formfeed, and the surface is covered with a passivating film 54, such as SIN layer, except the electrode pads 20.

Next, beams 16 are formed by a Si Deep RIE (Reactive Ion Etching) process. After that, the movable mass 14 is formed in a Si Deep RIE process carried out from the Si substrate. Next, the movable mass 14 is released from the substrate in an etching process to the buried oxide layer. After that, the substrate is cut to form individual sensor chips in a dicing process. Next, the sensor chip 10 is bonded in a package. Then, the electrode pads 20 of the sensor chip 10 and lead pads of the package are wire bonded for electrical connection. At the same time, the wires 22 are formed over the sensor chip 10.

Figure 17:
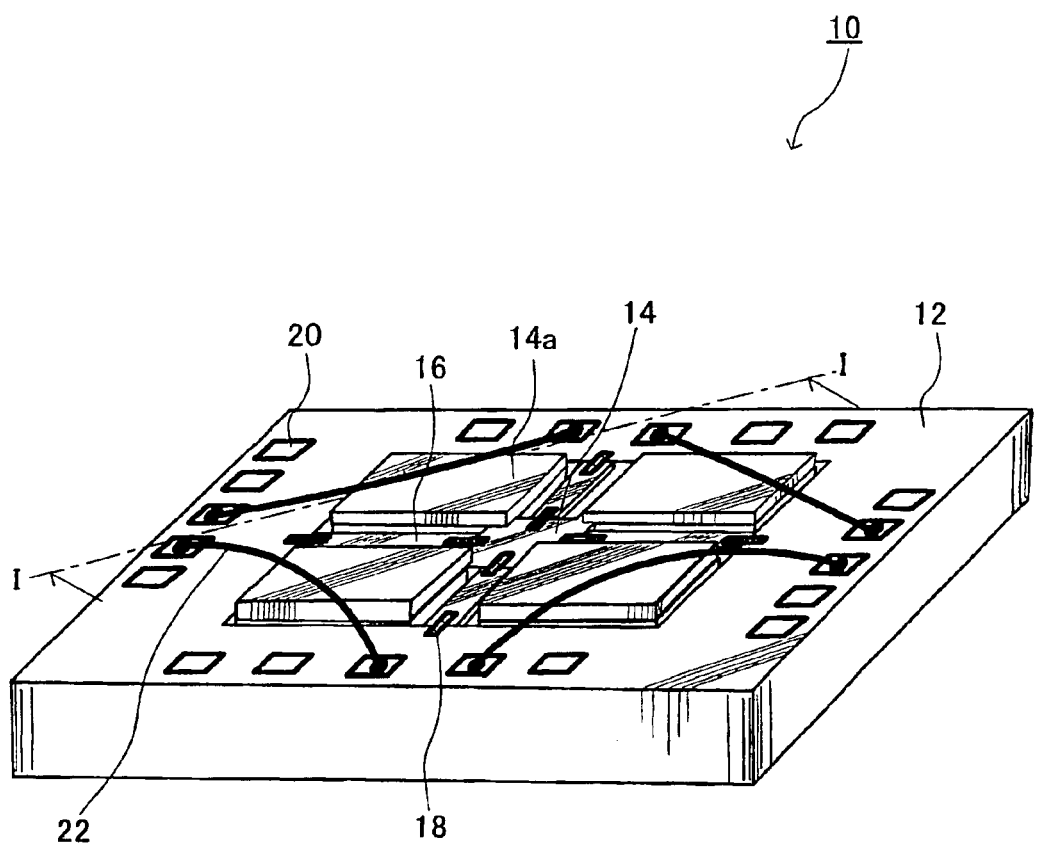
FIG. 17 is a perspective view illustrating an accelerometer according to a fifth preferred embodiment of the present invention.
Figure 18:
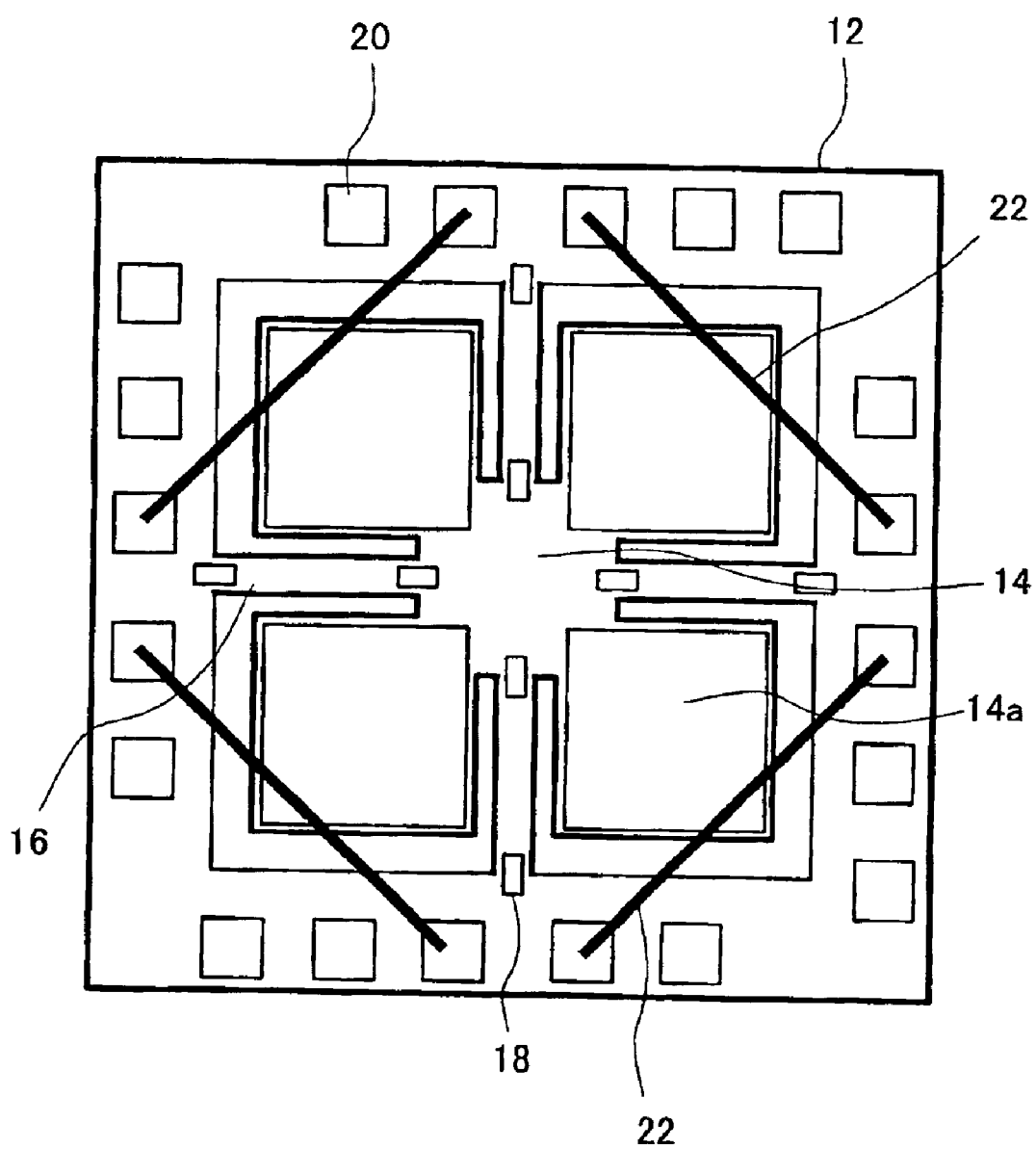
FIG. 18 is a plane view showing an arrangement of stopper wires used for an accelerometer according to the fifth preferred embodiment.
Figure 19:
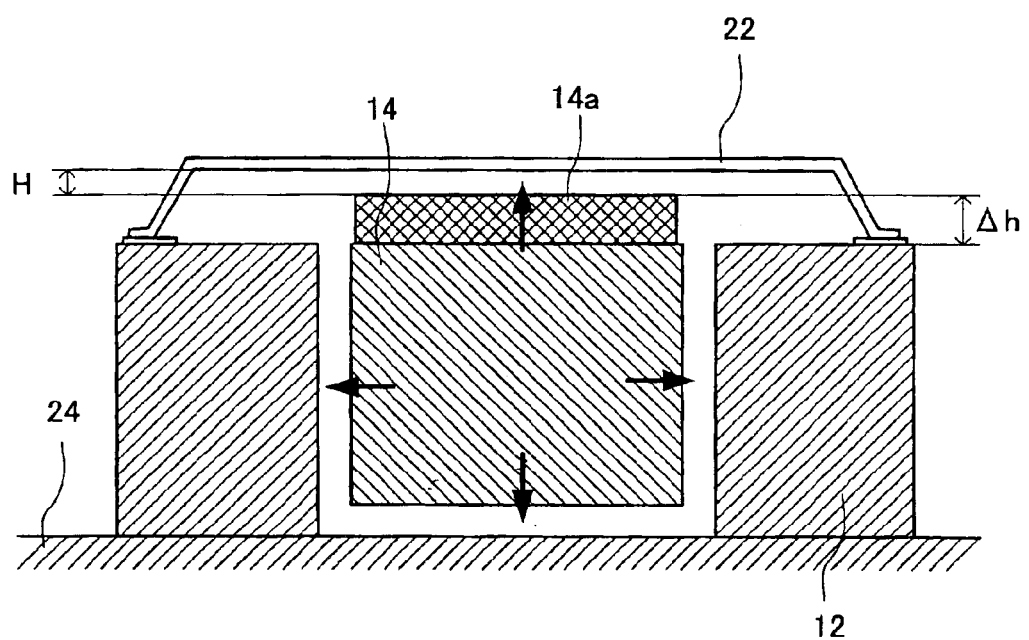
FIG. 19 is a cross-sectional view illustrating an accelerometer according to a sixth preferred embodiment of the present invention.

FIGS. 17 and 18 show an accelerometer 10 according to a fifth preferred embodiment of the present invention. In FIG. 18, small parts, such as metal interconnection, are not shown for better understanding of overall of the accelerometer 10. FIG. 19 shows an inside structure of the accelerometer 10. The accelerometer 10 includes a silicon base member 12, and a movable mass 14, which is contained in a cavity of the silicon base member 12. The mass 14 is provided so as to be able to move up-and-down and right-and-left in three-dimensions. The silicon base member 12 is provide at its center with a square shape cavity, in which the mass 14 is contained. The movable mass 14 is shaped to be a cloverleaf having four square regions, which are connected at the center thereof, in order to increase inertia force.

Projected member 14a is formed on each of the four square regions of the mass 14 so that an upper surface of the projected member 14a is "Δh" higher than an upper surface of the silicon base member 12.

The accelerometer 10 further includes four beams 16, which connect the mass 14, base member 12, and eight of piezoresistance elements 18. The piezoresistance elements 18 are arranged at the boundaries between the mass 14 and the beams 16, and between the base member 12 and the beams 16. Each of the beams 16 is arranged at a gap formed between two adjacent square parts of the mass 14. The silicon base member 12 is provided at the upper surface with electrode pads, which are connected to the piezoresistance elements 18 with a metal interconnection (not shown).

Electrode pads 20, which are not connected to the piezoresistance elements 18, are connected to ends of stopper wires 22. Four of the wires 22 are arranged above all the corners of the movable mass 14. Each wire 22 is arranged to extend across a corner of the movable mass 14. The ends of the wire 22 are fixed to the electrode pads 20 by a conventional wire-bonding process.

As shown in FIG. 19, the silicon base member 12 is fixed on to a die bond surface 24. Downward over move of the movable mass 14 is inhibited by the die bond surface 24. Horizontal over move of the mass 14 is inhibited by inner walls of the silicon base member 12. Upward over-move of the mass 14 is inhibited by the wires 22. The clearance between the mass 14 and the wires 22 can be adjusted by controlling the wire bonding device.

A distance "H" between the upper surface of the projected member 14a and the stopper wire 22 can be adjusted by a wire-bonding device (not shown) and the height difference "Δh". According to this embodiment, a distance "H" can be decreased without increasing a distance "H+Δh". As a result, the thickness of the accelerometer 10 can be reduced without increasing irregularity of clearance "H" of stopper wires 22. Even if a distance "H" is determined about 80 μm, irregularity of clearance "H" of stopper wires 22 would not increase remarkably.

Figure 20A:
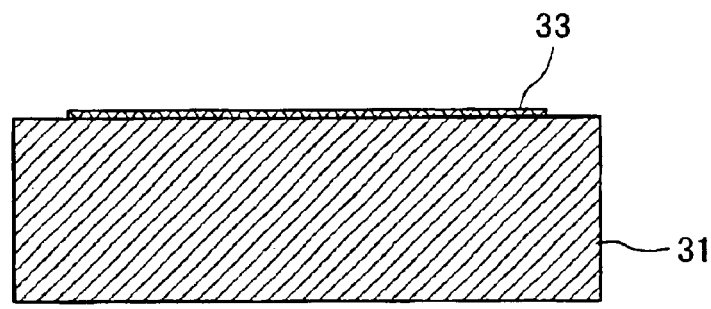
FIGS. 20A–20D are cross-sectional views showing one example of fabricating steps of the accelerometer according to the sixth preferred embodiment, shown in FIG. 19.

FIGS. 20A–20D are cross-sectional views showing one example of the fabricating steps of the accelerometer according to the sixth preferred embodiment, shown in FIG. 19. In fabricating the above-described accelerometer 10, a SOI wafer 31 was formed from a silicon layer (Si), a buried oxide layer (SiO2) and a Si substrate. A bridge circuit was formed on the silicon layer in a semiconductor process to form piezoresistance elements 18, a metal circuit pattern and electrode pads 20. A sensor circuit 33 is formed, as shown in FIG. 20A.

Figure 20B:
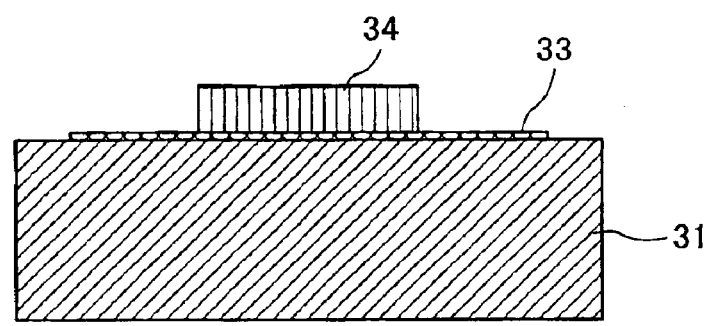

Next, a photosensitive polyimide or resist is formed on to the sensor circuit 33 using a spin-coating process, and is exposed, developed and baked to form a projected member 34 (14a), as shown in FIG. 20B.

Figure 20C:
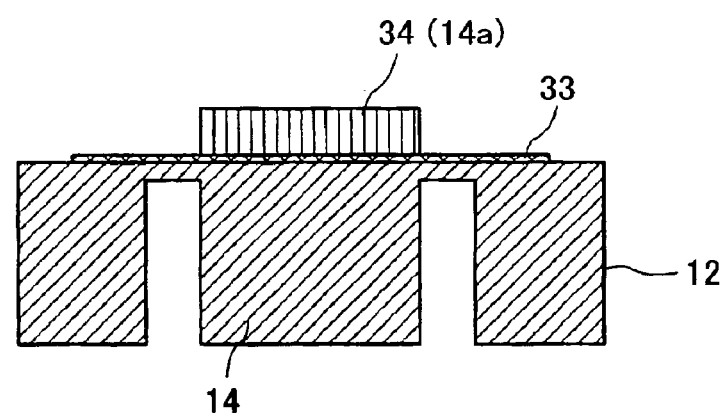
Figure 20D:
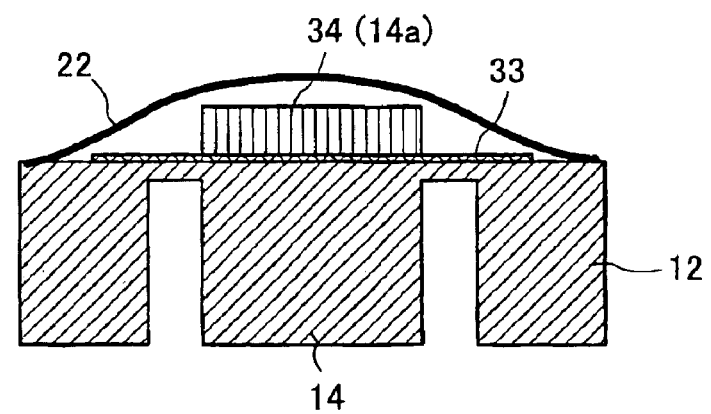

Subsequently, beams 16 are formed in a Si Deep RIE (Reactive Ion Etching) process. After that, the movable mass 14 is formed in a Si Deep RIE process carried out from the Si substrate 31. Next, the movable mass 14 is released from the substrate 31 in an etching process to the buried oxide layer, as shown in FIG. 20C. After that, the substrate 31 is cut to form individual sensor chips in a dicing process. Next, the sensor chip is bonded in a package, and the electrode pads 20 of the sensor chip 10 and the lead pads of the package are wire bonded for electrical connection. At the same time, the wires 22 are formed over the sensor chip 10.

Figure 21A:
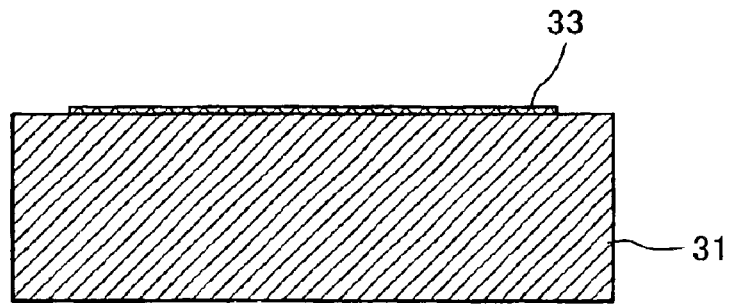
FIGS. 21A–21G are cross-sectional views showing another example of fabricating steps of the accelerometer according to the sixth preferred embodiment, shown in FIG. 19.

FIGS. 21A–21G are cross-sectional views showing another example of fabricating steps of the accelerometer 10 according to the sixth preferred embodiment, shown in FIG. 19. In fabrication of the above described accelerometer 10, a SOI wafer 31 is formed from a silicon layer (Si), a buried oxide layer (SiO2) and a Si substrate. A bridge circuit is formed on the silicon layer in a semiconductor process to form piezoresistance elements 18, a metal circuit pattern and electrode pads 20. A sensor circuit 33 is formed, as shown in FIG. 21A.

Figure 21B:
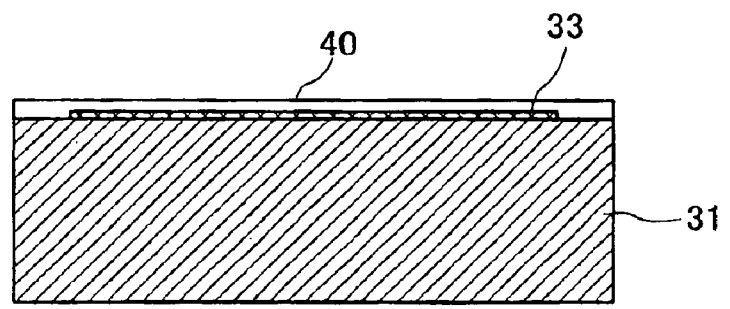
Figure 21C:
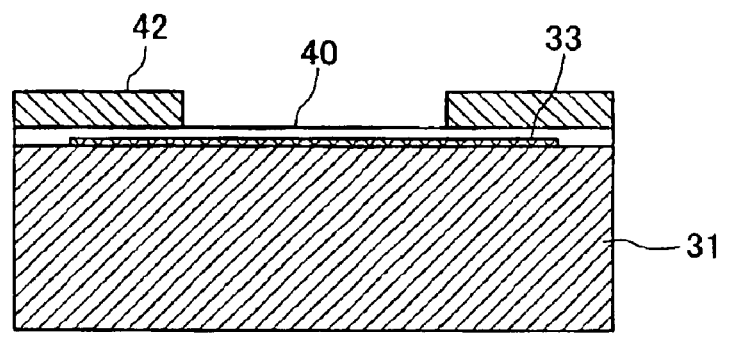

Next, seed layer 40 is formed over the SOI wafer 31 in a sputtering process, as shown in FIG. 21B. The seed layer 40 may be of Ni, Cu, Au, Pd, Ag, Sn, Co or the like. After that, photosensitive polyimide or resist is formed on to the seed layer 40 in a spin-coating process, and is exposed, developed and baked to form a resist pattern 42, as shown in FIG. 21C.

Figure 21D:
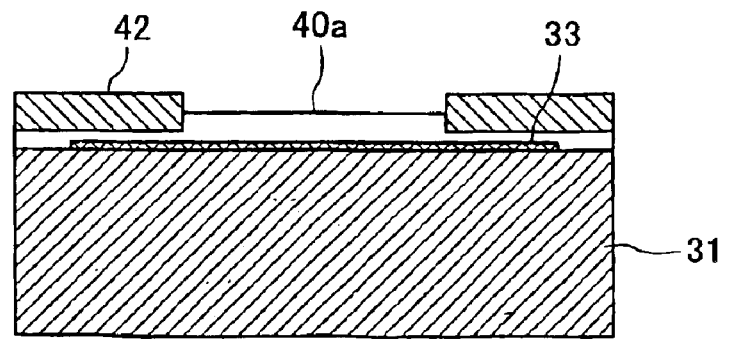
Figure 21E:
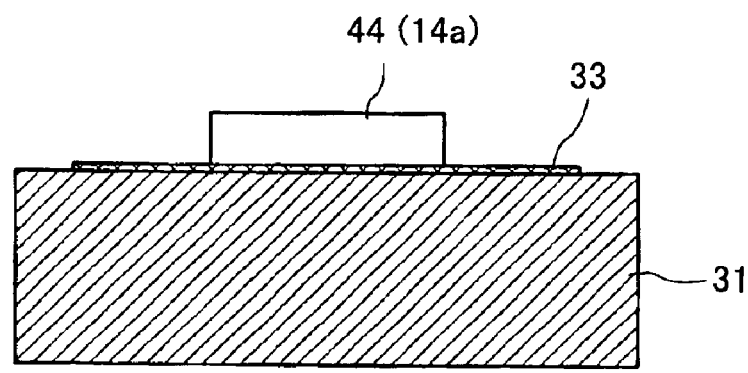

Next, a plating layer 40a is formed from the seed layer 40, as shown in FIG. 21D. After that, the resist pattern 42 is removed, and the seed layer 40 is removed in an ion-milling process, wet etching process or RIE (Reactive Ion Etching) process to form a projected member 44, as shown in FIG. 21E.

Figure 21F:
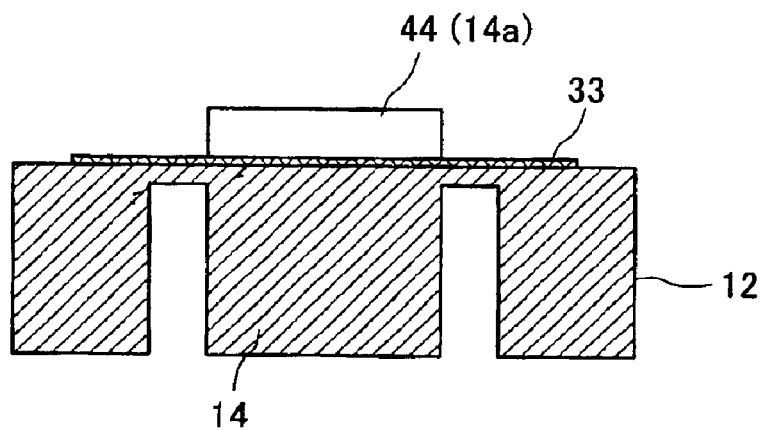
Figure 21G:
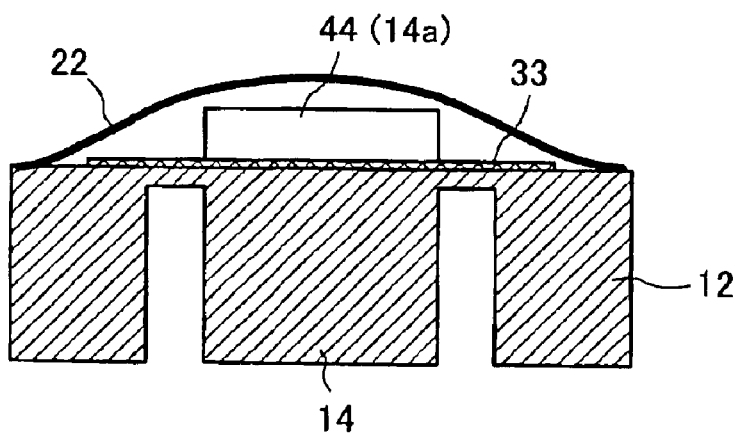

Subsequently, beams 16 are formed in a Si Deep RIE (Reactive Ion Etching) process. After that, the movable mass 14 is formed in a Si Deep RJE process carried out from the Si substrate 31. Next, the movable mass 14 is released from the substrate 31 in an etching process to the buried oxide layer, as shown in FIG. 21F. After that, the substrate 31 is cut to form individual sensor chips in a dicing process. Next, the sensor chip is bonded in a package, then, the electrode pads 20 of the sensor chip 10 and lead pads of the package are wire bonded for electrical connection. At the same time, the wires 22 are formed over the sensor chip 10, as shown in FIG. 21G.

Figure 22A:
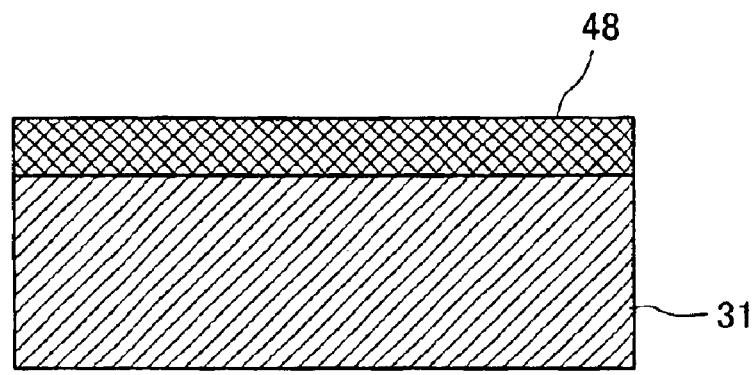
FIGS. 22A–22F are cross-sectional views showing another example of fabrication steps of the accelerometer according to the sixth preferred embodiment, shown in FIG. 19.
Figure 22B:
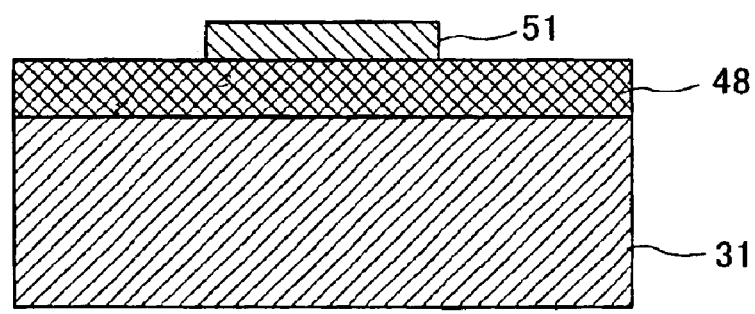

FIGS. 22A–22F are cross-sectional views showing another example of the fabrication steps used to manufacture the the accelerometer 10 according to the sixth preferred embodiment, shown in FIG. 19. In fabrication of the above described accelerometer 10, a SOI wafer 31 was formed from a silicon layer (Si), a buried oxide layer (SiO2) and a Si substrate. Next, a polysilicon layer 48 was formed on the SOI wafer 31, as shown in FIG. 22A. Subsequently, a photosensitive polyimide or resist was formed on to the polysilicon layer 48 in a spin-coating process, and was exposed, developed and baked to form a resist pattern 51, as shown in FIG. 22B.

Figure 22C:
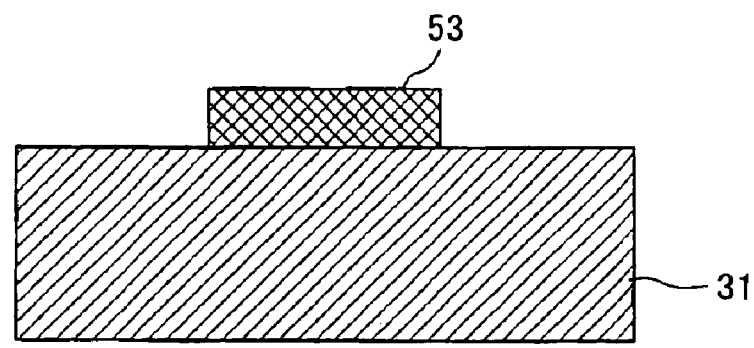
Figure 22D:
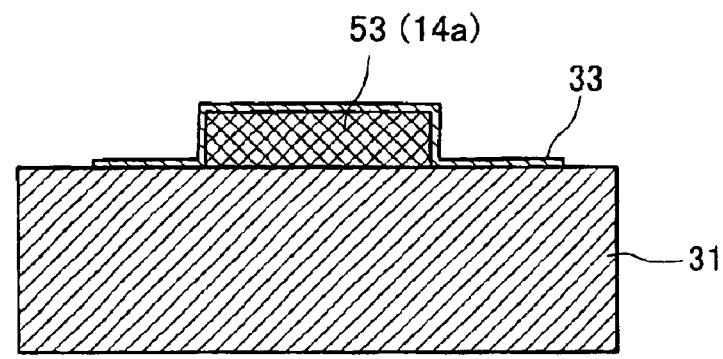

Next, the polysilicon layer 48 is etched in a RIE process to form a projected member 53, as shown in FIG. 22C. Subsequently, a bridge circuit is formed in a semiconductor process to form piezoresistance elements 18, a metal circuit pattern and electrode pads 20. A sensor circuit 33 is formed over the projected member 53, as shown in FIG. 22D. After that, the surface is covered with a passivating film, such as SiN layer, except the electrode pads 20.

Figure 22E:
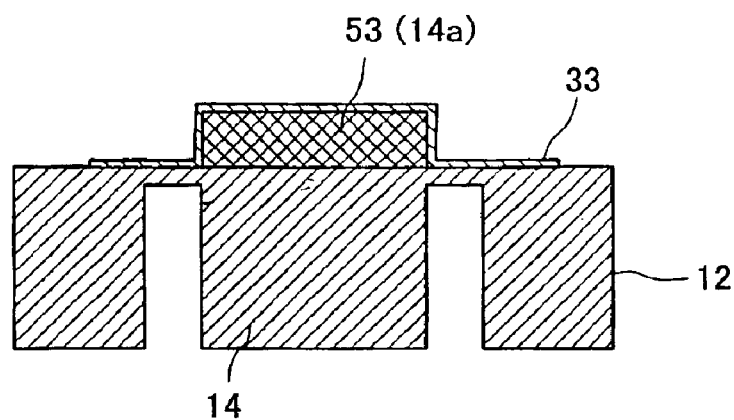
Figure 22F:
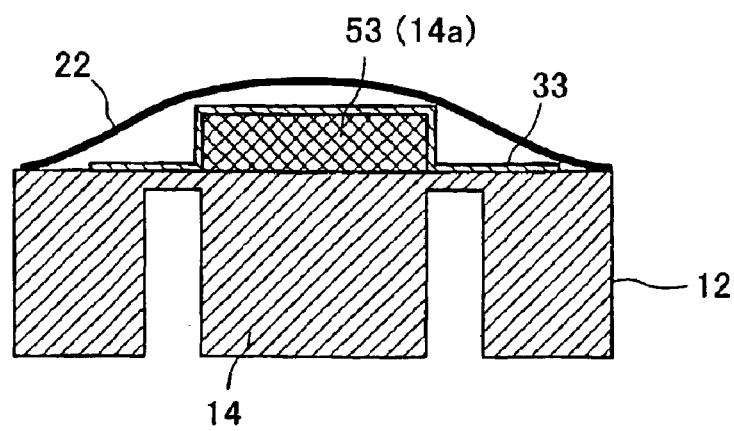

Subsequently, beams 16 are formed in a Si Deep RIE (Reactive Ion Etching) process. After that, the movable mass 14 is formed in a Si Deep RIE process carried out from the Si substrate 31. Next, the movable mass 14 is released from the substrate 31 in an etching process to the buried oxide layer, as shown in FIG. 22E. After that, the substrate 31 is cut to form individual sensor chips in a dicing process. Next, the sensor chip is bonded in a package, then, the electrode pads 20 of the sensor chip 10 and lead pads of the package are wire bonded for electrical connection. At the same time, the wires 22 are formed over the sensor chip 10, as shown in FIG. 22F.

Figure 23:
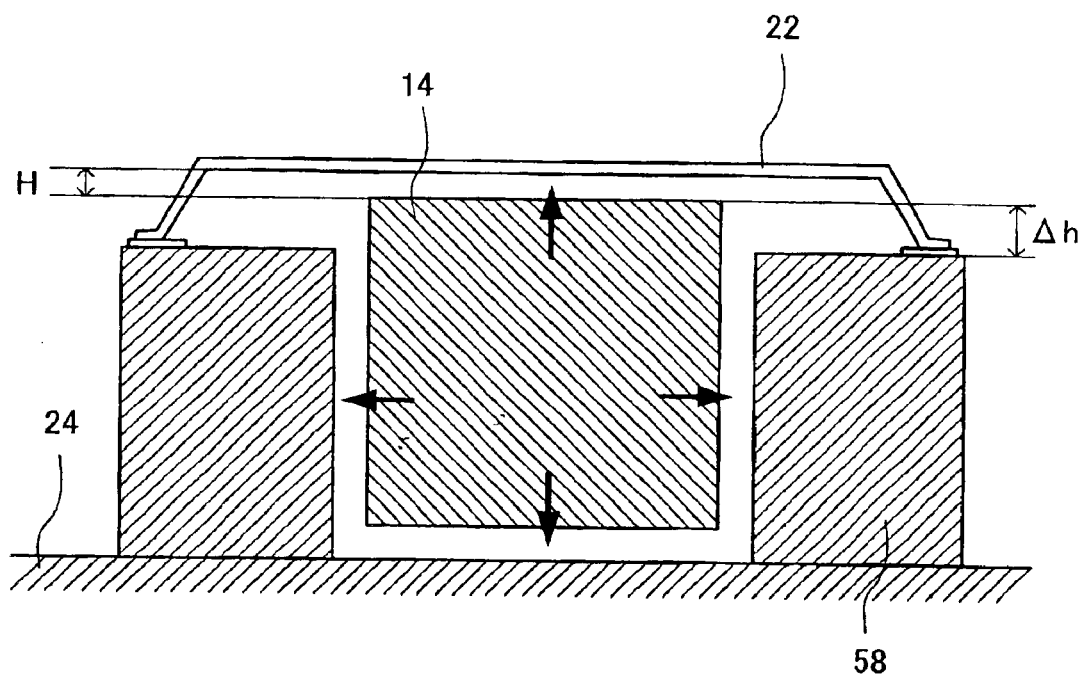
FIG. 23 is a cross-sectional view illustrating an accelerometer according to a seventh preferred embodiment of the present invention.

FIG. 23 is a cross-sectional view illustrating an accelerometer according to a seventh preferred embodiment of the present invention. FIGS. 24A–24E are cross-sectional views showing an example of the fabrication steps used to manufacture the accelerometer according to the seventh preferred embodiment, shown in FIG. 23. In FIGS. 23 and 24A–24E, the same or corresponding elements to those in the above-described sixth preferred embodiment are represented by the same reference numerals here, and their description is not repeated here in this embodiment. The difference between this embodiment and the six preferred embodiment is that structure of a movable mass 14 and a silicon base member 53. In this embodiment, the mass 14 is not provided with any projected member (14a), but an upper surface of the silicon base member 58 is cut out in order to form a level difference "Δh" between the upper surface of the base member 58 and an upper surface of the mass 14.

Figure 24A:
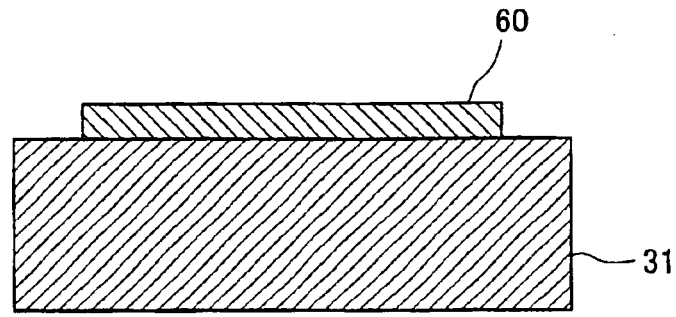
FIGS. 24A–24E are cross-sectional views showing an example of fabrication steps of the accelerometer according to the seventh preferred embodiment, shown in FIG. 23.
Figure 24B:
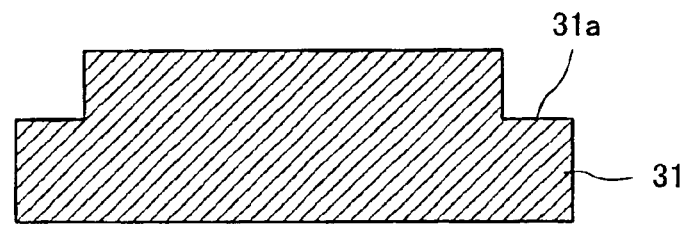
Figure 24C:
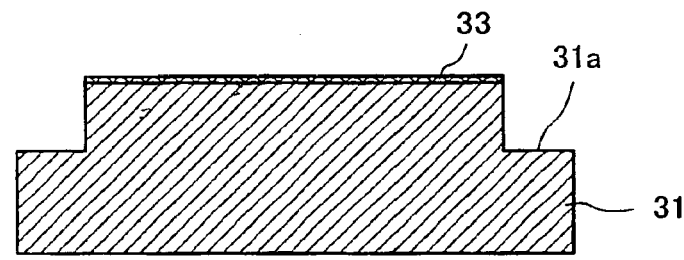
Figure 24D:
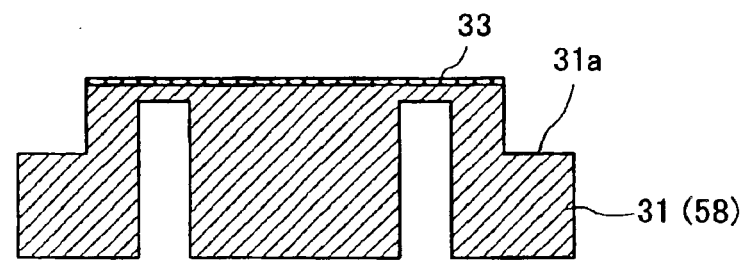
Figure 24E:
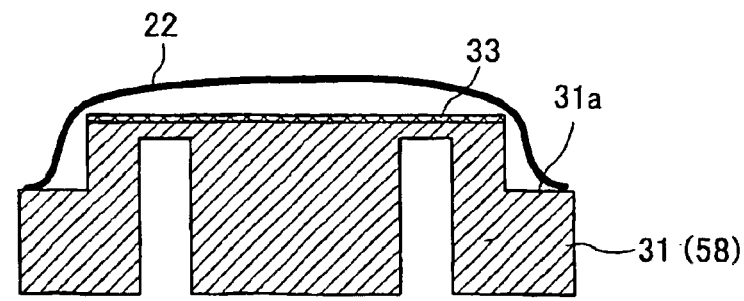

To fabricate the above-described accelerometer, a SOI wafer 31 was formed from a silicon layer (Si), a buried oxide layer (SiO2) and a Si substrate. Next, a resist was formed on to the SOI wafer 31 in a spin-coating process, and was exposed, developed and baked to form a resist pattern 60, as shown in FIG. 24A. After that, the SOI wafer 31 was etched in a RIE process to form recess portions 31a, which are used as electrode pads, as shown in FIG. 24E.

Next, a bridge circuit was formed in a semiconductor process to form piezoresistance elements 18, a metal circuit pattern and electrode pads 20. A sensor circuit 33 is formed on the SOI wafer 31, as shown in FIG. 24C. After that, the surface of the substrate 31 is covered with a passivating film, such as SiN layer, except the electrode pads 31a.

Subsequently, beams 16 were formed in a Si Deep RIE (Reactive Ion Etching) process. After that, the movable mass 14 was formed in a Si Deep RIE process carried out from the Si substrate 31. Next, the movable mass 14 was released from the substrate 31 in an etching process to the buried oxide layer, as shown in FIG. 24D. After that, the substrate 31 was cut to form individual sensor chips in a dicing process. Next, the sensor chip was bonded in a package, then, the electrode pads 31a of the sensor chip 10 and lead pads of the package were wire bonded for electrical connection. At the same time, the wires 22 were formed over the sensor chip 10, as shown in FIG. 24E.

Figure 25:
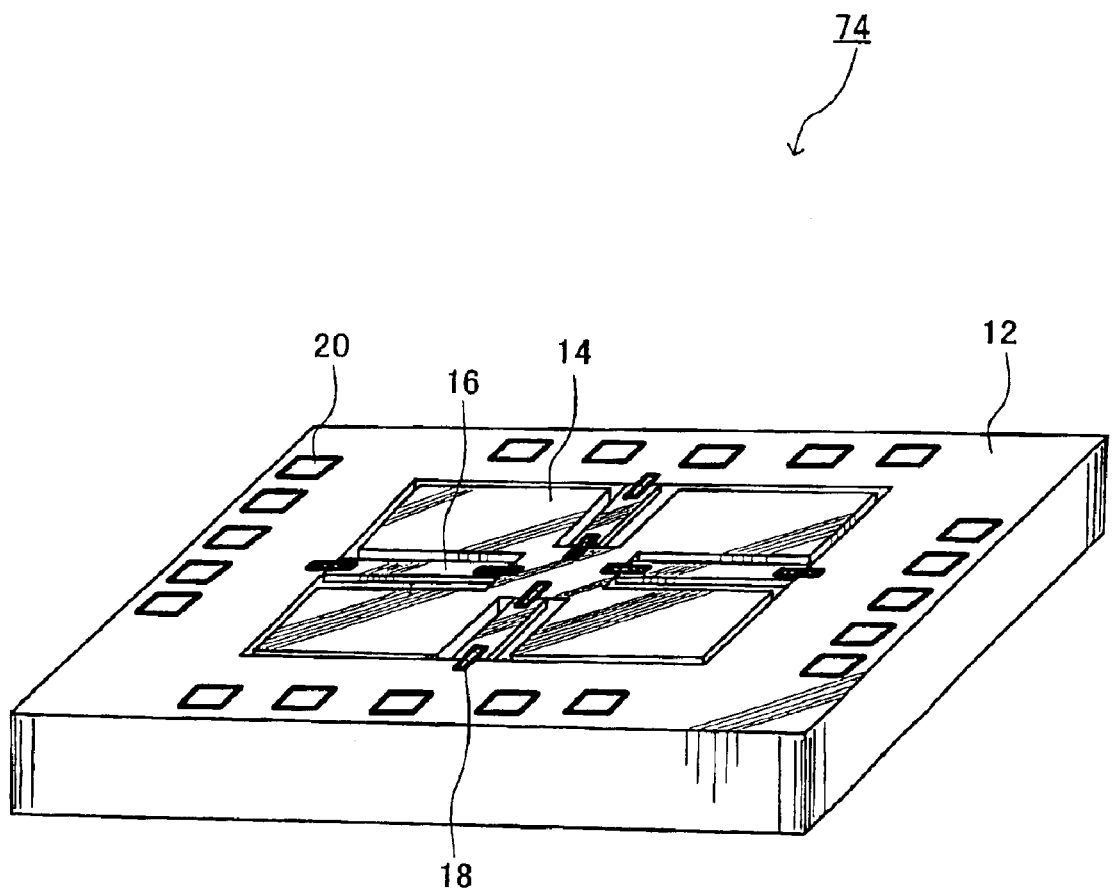
FIG. 25 is a perspective view illustrating an accelerometer according to an eighth preferred embodiment of the present invention.
Figure 26:
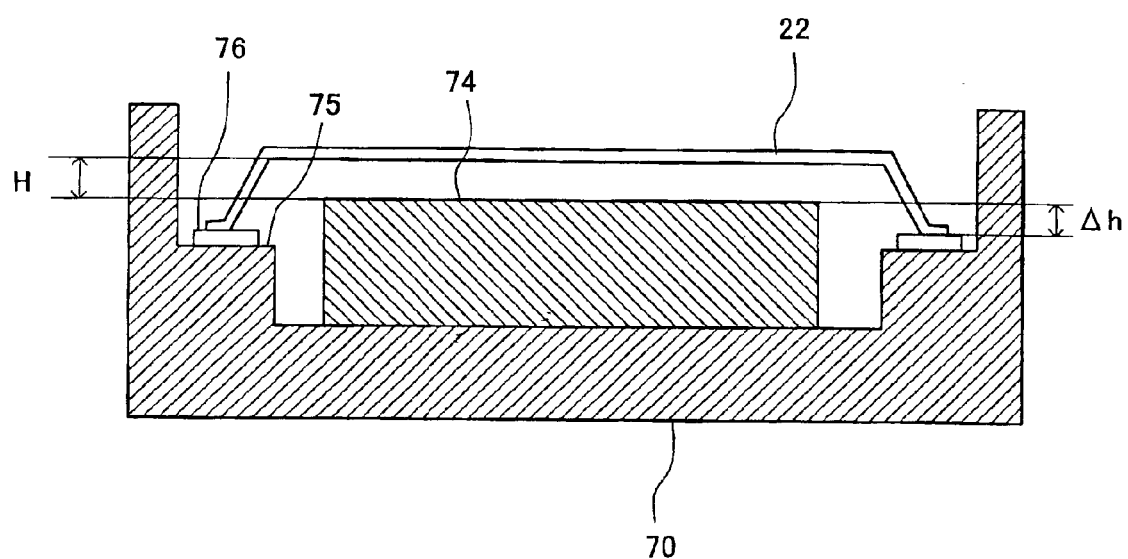
FIG. 26 is a cross-sectional view illustrating an accelerometer according to the eighth preferred embodiment, shown in FIG. 25.

FIG. 25 is a perspective view illustrating an accelerometer 74 according to an eighth preferred embodiment of the present invention. FIG. 26 is a cross-sectional view illustrating the accelerometer 74, shown in FIG. 25. In FIGS. 25 and 26, the same or corresponding elements to those in the above-described embodiments are represented by the same reference numerals, and the same description is not repeated here in this embodiment.

The accelerometer 74 includes a silicon base member 12, and a movable mass 14, which is contained in a cavity of the silicon base member 12. The mass 14 is provided so as to be able to move up-and-down and right-and-left in three-dimensions. The silicon base member 12 is provided at its center with a square shape cavity, in which the mass 14 is contained. The movable mass 14 is shaped to be a cloverleaf having four square regions, which are connected at the center thereof, in order to increase inertia force. An upper surface of the movable mass 14 and an upper surface of the base member 12 are arranged in the same level.

The accelerometer 74 further includes four beams 16, which connect the mass 14 and base member 12, and eight piezoresistance elements 18. The piezoresistance elements 18 are arranged at the boundaries between the mass 14 and the beams 16, and between the base member 12 and the beams 16. Each of the beams 16 is arranged at a gap formed between two adjacent square parts of the mass 14. The silicon base member 12 is provided at the upper surface with electrode pads 20, which are connected to the piezoresistance elements 18 with a metal interconnection (not shown).

The accelerometer 74 is contained in a package 70, shown in FIG. 26. The package 70 includes recess portions 75 and lead pads 74, which are formed on the recess portions 75. The recess portions 75 and lead pads 76 are designed so that an upper surface of the lead pad 76 is "Δh" lower than an upper surface of the accelerometer (sensor) 74. Two lead pads, arranged at the opposite sides of the accelerometer 74, are connected by a stopper wire 22. According to the eight preferred embodiment, the same advantages can be obtained as the above described sixth and seventh preferred embodiments.

According to the sixth to eighth preferred embodiments, the stopper wire 22 includes ends to be fixed at positions that are relatively lower in level than the surface of the mass 14. A distance "H" between an upper surface of the mass 14 and the stopper wire 22 can be decreased without increasing a distance (H+Δh) in vertical direction between ends and top of the wire 22. As a result, the thickness of a microstructure can be reduced without increasing irregularity of clearance or heights of stopper wires 22.

What is claimed is:

1. A microstructure having a movable mass, comprising: a mass; a base member in which the mass is movably contained, wherein the mass comprises a surface which is exposed out of the base member, and a stopper wire which is arranged above the surface of the mass so as to inhibit over move of the mass, wherein the stopper wire comprises ends to be fixed at positions which are relatively lower in level than the surface of the mass.

2. A microstructure according to claim 1, wherein a projecting portion is formed on the surface of the mass.

3. A microstructure according to claim 2, wherein the projecting portion is a resin layer formed on the surface of the mass.

4. A microstructure according to claim 2, wherein the projecting portion is a plating layer formed on the surface of the mass.

5. A microstructure according to claim 2, wherein the projecting portion is a polysilicon layer formed on the surface of the mass.

6. A microstructure according to claim 1, wherein the base member is provided with wire-fixing regions which are connected with the ends of the stopper wire, the wire-fixing regions being formed to have surfaces lower in level than the surface of the mass.

7. A microstructure according to claim 6, wherein the wire-fixing regions are formed to shape the base member to be stepped structures.

8. An accelerometer which provides an output signal in accordance with the movement of a mass, comprising: a mass; a silicon base member in which the mass is movably contained, wherein the mass comprises a surface which is exposed out of the base member; a stopper wire which is arranged above the surface of the mass so as to inhibit over move of the mass; and a package which contains the base member with the mass, wherein the package comprises at least one lead pad used for electrical connection with the microstructure, and at least one end of the stopper wire is connected to the lead pad.

9. An accelerometer according to claim 8, wherein both ends of the stopper wire is connected to the lead pads.

10. An accelerometer according to claim 8, wherein one end of the stopper wire is connected to the lead pads, and the other end is connected to an electrode pad of the base member.

11. An accelerometer according to claim 8, wherein the stopper wire comprises ends to be fixed at positions which are relatively lower in level than the surface of the mass.

12. An accelerometer which provides an output signal in accordance with the movement of a mass, comprising: a mass; a silicon base member in which the mass is movably contained, wherein the mass comprises a surface which is exposed out of the base member; a stopper wire which is arranged above the surface of the mass so as to inhibit over move of the mass; and a package which contains the base member with the mass, wherein the stopper wire comprises ends to be fixed at position which are relatively lower in level than the surface of the mass.

13. An accelerometer according to claim 12, wherein the package comprises at least one lead pad used for electrical connection with the microstructure, wherein at least one end of the stopper wire is connected to the lead pad.

14. An accelerometer according to claim 12, wherein both ends of the stopper wire are connected to the pads.

15. An accelerometer according to claim 12, wherein one end of the stopper wire is connected to the lead pad, and the other end is connected to an electrode pad of the base member.

* * * * *